(12) United States Patent
Tanaka et al.

(10) Patent No.: US 12,101,983 B2
(45) Date of Patent: Sep. 24, 2024

(54) DISPLAY DEVICE EQUIPPED WITH TOUCH PANEL, AND METHOD FOR CONTROLLING DISPLAY DEVICE

(71) Applicant: Sharp Kabushiki Kaisha, Sakai (JP)

(72) Inventors: Yuta Tanaka, Sakai (JP); Masaaki Nishio, Sakai (JP); Kazuki Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/276,944

(22) PCT Filed: Mar. 12, 2021

(86) PCT No.: PCT/JP2021/010007
§ 371 (c)(1),
(2) Date: Aug. 11, 2023

(87) PCT Pub. No.: WO2022/190347
PCT Pub. Date: Sep. 15, 2022

(65) Prior Publication Data
US 2024/0138228 A1 Apr. 25, 2024
US 2024/0237471 A9 Jul. 11, 2024

(51) Int. Cl.
G06F 3/041 (2006.01)
G09G 3/3275 (2016.01)
H10K 59/40 (2023.01)

(52) U.S. Cl.
CPC ............ *H10K 59/40* (2023.02); *G06F 3/0412* (2013.01); *G06F 3/04164* (2019.05); *G06F 3/04166* (2019.05); *G09G 3/3275* (2013.01); *G09G 2300/0404* (2013.01)

(58) Field of Classification Search
CPC ... H10K 59/40; G06F 3/0412; G06F 3/04164; G06F 3/04166; G09G 3/3275; G09G 2300/0404
See application file for complete search history.

(56) References Cited

U.S. PATENT DOCUMENTS

2016/0104422 A1    4/2016 Kishi et al.

FOREIGN PATENT DOCUMENTS

WO    2015/016196 A1    2/2015

*Primary Examiner* — Towfiq Elahi
(74) *Attorney, Agent, or Firm* — Keating & Bennett, LLP

(57) ABSTRACT

Regarding a display device (a display device including display elements driven by currents) equipped with a touch panel, degradation in display quality caused by touch is suppressed. A display device equipped with a touch panel is provided with a determination circuit (303) that determines whether or not a characteristic detection process is influenced by touch, based on a touch position and a monitoring target row which is a row to be subjected to the characteristic detection process. When the determination circuit (303) determines that the characteristic detection process is influenced by touch, a display control circuit (301) controls operation of a gate driver (12) and a source driver (20) such that a normal characteristic detection process is stopped until the determination circuit (303) determines that the characteristic detection process is not influenced by touch.

20 Claims, 33 Drawing Sheets

TO TOUCH CONTROLLER

Fig.10

|   | A  | B  | C  | D   | E   | F   | G  |
|---|----|----|----|-----|-----|-----|----|
| 1 | 35 | 47 | 53 | 68  | 92  | 62  | 55 |
| 2 | 43 | 56 | 64 | 110 | 120 | 111 | 66 |
| 3 | 53 | 62 | 93 | 133 | 220 | 130 | 93 |
| 4 | 44 | 51 | 69 | 113 | 127 | 116 | 65 |
| 5 | 37 | 44 | 57 | 69  | 96  | 60  | 53 |

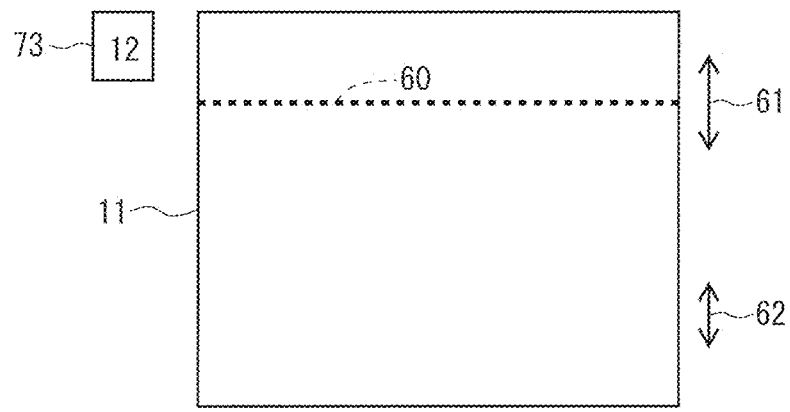
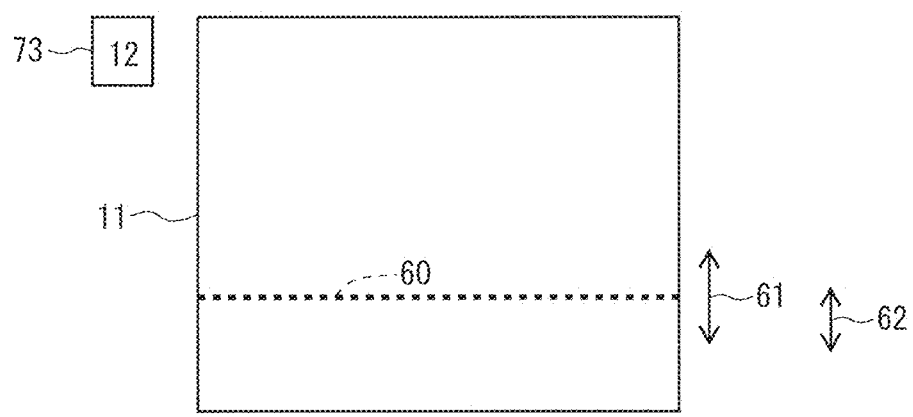

Fig.42
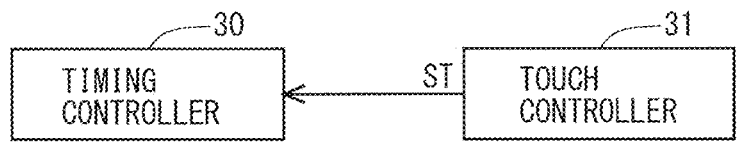
Fig.43
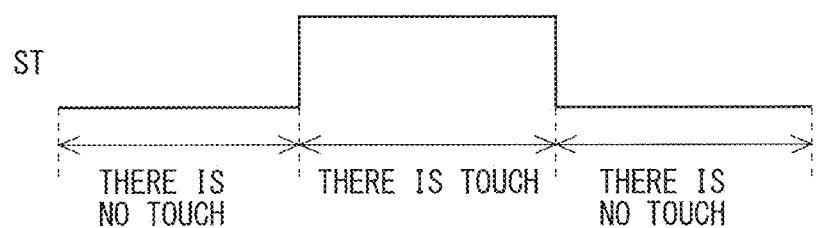
Fig.44

DISPLAY DEVICE EQUIPPED WITH TOUCH PANEL, AND METHOD FOR CONTROLLING DISPLAY DEVICE

TECHNICAL FIELD

The following disclosure relates to a display device (e.g., an organic EL display device) that includes a touch panel and adopts an external compensation scheme as a scheme for a compensation process, and a control method for the display device.

BACKGROUND ART

In recent years, there has been a remarkable spread of an organic EL display device including pixel circuits each including an organic EL element. The organic EL element is also called an organic light-emitting diode (OLED), and is a self-emissive display element that emits light at luminance determined based on a current flowing therethrough. As such, since the organic EL element is a self-emissive display element, the organic EL display device can easily achieve slimming down, compared to a liquid crystal display device that requires a backlight, a color filter, and the like.

Meanwhile, as drive systems for the organic EL display device, there are known a passive matrix system (also called a simple matrix system.) and an active matrix system. An organic EL display device that adopts the passive matrix system is simple in structure, but has difficulty in increasing size and increasing definition. On the other hand, an organic EL display device that adopts the active matrix system (hereinafter, referred to as "active matrix-type organic EL display device".) can easily achieve an increase in size and an increase in definition compared to the organic EL display device that adopts the passive matrix system.

In the active matrix-type organic EL display device, a plurality of pixel circuits are formed in matrix form. Each pixel circuit includes a drive transistor that controls supply of a current to an organic EL element. As the drive transistor, typically, a thin-film transistor (TFT) is adopted. However, a threshold voltage of the thin-film transistor changes by degradation. Multiple drive transistors are provided in a display unit of the organic EL display device and the level of degradation differs between the drive transistors, and thus, variations occur in the threshold voltage. As a result, variations in luminance occur, degrading display quality. In addition, the current efficiency of the organic EL element decreases over time. That is, even if a constant current is supplied to the organic EL element, luminance gradually decreases over time. As a result, burn-in occurs. For those reasons, the active matrix-type organic EL display device performs a process of compensating for degradation of the drive transistors or degradation of the organic EL elements.

As one scheme for a compensation process, an external compensation scheme is known. According to the external compensation scheme, a current flowing through a drive transistor or an organic EL element under a predetermined condition is measured by a circuit provided external to a pixel circuit. Then, based on a result of the measurement, an input image signal is corrected. By this, degradation of the drive transistor or degradation of the organic EL element is compensated for.

In this specification, a series of processes for measuring, outside a pixel circuit, a current flowing through the pixel circuit to compensate for degradation of a drive transistor or an organic EL element (display element) are referred to as "characteristic detection process", a period during which the characteristic detection process is performed is referred to as "characteristic detection period", and a period during which a current is actually measured in the characteristic detection period is referred to as "current measurement period". In addition, a characteristic of the drive transistor provided in the pixel circuit is referred to as "TFT characteristic", and a characteristic of the organic EL element provided in the pixel circuit is referred to as "OLED characteristic".

Meanwhile, in recent years, an organic EL display device equipped with a touch panel is becoming popular. Examples of the organic EL display device equipped with a touch panel include smartphones and tablet terminals. In a case in which the organic EL display device equipped with a touch panel adopts the external compensation scheme as a scheme for a compensation process, when driving noise of the touch panel has occurred during performance of the characteristic detection process, currents may not be properly measured due to the driving noise. Hence, there is a concern that input image signals may not be appropriately corrected, degrading display quality.

In view of this, WO 2015/016196 A discloses an organic EL display device that is configured not to perform the characteristic detection process when noise greater than or equal to a reference value is detected during a noise measurement period which is a predetermined period included in one frame period.

PRIOR ART DOCUMENT

Patent Document

[Patent Document 1] WO 2015/016196 A

SUMMARY

Problems to be Solved by the Invention

Meanwhile, in an organic EL display device equipped with a touch panel, the value of monitoring data (data measured to determine the TFT characteristic or the OLED characteristic) for an area around a portion touched with a finger may be different from an original value. This event is considered to occur for the following reason: When an area around a monitoring target row (a row to be subjected to the characteristic detection process) is touched as shown in FIG. 48, the temperature of an area around the touched portion (a region given reference character 90 in FIG. 48) increases, by which the amount of current flowing through the drive transistor or the organic EL element increases in the monitoring target row. When monitoring data having a different value from an original value is used, an input image signal is not appropriately corrected. As a result, display quality degrades. The organic EL display device disclosed in WO 2015/016196 A does not take into account an increase in temperature caused by touch.

An object of the following disclosure is therefore to suppress degradation in display quality caused by touch regarding a display device (a display device including display elements driven by currents) equipped with a touch panel.

Means for Solving the Problems

A display device according to some embodiments of the present disclosure is a display device including: a display unit including a plurality of pixel circuits that form a pixel matrix of a plurality of rows×a plurality of columns, each of the plurality of pixel circuits having a display element driven by a current, and a drive transistor for controlling a current to be supplied to the display element; and a touch panel for detecting a touch position on the display unit, the display device including:
- a display drive circuit configured to drive the plurality of pixel circuits while performing a characteristic detection process to compensate for degradation of the drive transistor or the display element, the characteristic detection process including a process of measuring a current flowing through each of the plurality of pixel circuits;
- a sensor value obtaining circuit configured to obtain a sensor value that changes depending on a degree of approach of a detection object to the touch panel;
- a touch position identification circuit configured to identify a touch position on the display unit, based on the sensor value obtained by the sensor value obtaining circuit;
- a display control circuit configured to control operation of the display drive circuit such that the characteristic detection process is performed row-by-row and image display on the display unit is performed using video signals corrected based on current values obtained by performing the characteristic detection process; and
- a determination circuit configured to determine whether or not the characteristic detection process is influenced by touch, based on the touch position identified by the touch position identification circuit and a monitoring target row, the monitoring target row being a row to be subjected to the characteristic detection process, wherein
- when the determination circuit determines that the characteristic detection process is influenced by touch, the display control circuit controls operation of the display drive circuit such that the characteristic detection process of usual is stopped until the determination circuit determines that the characteristic detection process is not influenced by touch, and
- when the determination circuit determines that the characteristic detection process is not influenced by touch, the display control circuit controls operation of the display drive circuit such that the normal characteristic detection process of usual is performed.

A display device according to some other embodiments of the present disclosure is a display device including: a display unit including a plurality of pixel circuits that form a pixel matrix of a plurality of rows×a plurality of columns, each of the plurality of pixel circuits having a display element driven by a current, and a drive transistor for controlling a current to be supplied to the display element; and a touch panel for detecting a touch position on the display unit, the display device including:
- a first integrated circuit including a sensor value obtaining circuit configured to obtain a sensor value that changes depending on a degree of approach of a detection object to the touch panel; and a touch determination circuit configured to determine whether or not there is touch on the display unit, based on the sensor value obtained by the sensor value obtaining circuit; and
- a second integrated circuit including a display drive circuit configured to drive the plurality of pixel circuits while performing a characteristic detection process to compensate for degradation of the drive transistor or the display element, the characteristic detection process including a process of measuring a current flowing through each of the plurality of pixel circuits; and a display control circuit configured to control operation of the display drive circuit such that the characteristic detection process is performed row-by-row and image display on the display unit is performed using video signals corrected based on current values obtained by performing the characteristic detection process, wherein
- a touch determination signal indicating a result of the determination made by the touch determination circuit is transmitted from the first integrated circuit to the second integrated circuit,
- when the touch determination signal transmitted to the second integrated circuit indicates that there is touch on the display unit, the display control circuit controls operation of the display drive circuit such that the characteristic detection process of usual is stopped until the touch determination signal indicating that there is no touch on the display unit is transmitted to the second integrated circuit, and
- when the touch determination signal transmitted to the second integrated circuit indicates that there is no touch on the display unit, the display control circuit controls operation of the display drive circuit such that the characteristic detection process of usual is performed.

A controlling method (for a display device) according to some embodiments of the present disclosure is a method for controlling a display device including: a display unit including a plurality of pixel circuits that form a pixel matrix of a plurality of rows×a plurality of columns, each of the plurality of pixel circuits having a display element driven by a current, and a drive transistor for controlling a current to be supplied to the display element; and a touch panel for detecting a touch position on the display unit, wherein
the display device includes:
- a display drive circuit configured to drive the plurality of pixel circuits while performing a characteristic detection process to compensate for degradation of the drive transistor or the display element, the characteristic detection process including a process of measuring a current flowing through each of the plurality of pixel circuits; and
- a display control circuit configured to control operation of the display drive circuit such that the characteristic detection process is performed row-by-row and image display on the display unit is performed using video signals corrected based on current values obtained by performing the characteristic detection process, and the method including:
- a sensor value obtaining step of obtaining a sensor value that changes depending on a degree of approach of a detection object to the touch panel;
- a touch position identifying step of identifying a touch position on the display unit, based on the sensor value obtained in the sensor value obtaining step; and
- a determining step of determining whether or not the characteristic detection process is influenced by touch, based on the touch position identified in the touch position identifying step and a monitoring target row, the monitoring target row being a row to be subjected to the characteristic detection process, when it is determined in the determining step that the characteristic detection process is influenced by touch, the display control circuit controls operation of the display drive circuit such that the characteristic detection process of usual is stopped until it is determined in the determining step that the characteristic detection process is not influenced by touch, and when it is determined in the determining step that the characteristic detection process is not influenced by touch, the display control circuit controls operation of the display drive circuit such that the characteristic detection process of usual is performed.

A controlling method (for a display device) according to some other embodiments of the present disclosure is a method for controlling a display device including: a display unit including a plurality of pixel circuits that form a pixel matrix of a plurality of rows×a plurality of columns, each of the plurality of pixel circuits having a display element driven by a current, and a drive transistor for controlling a current to be supplied to the display element; and a touch panel for detecting a touch position on the display unit, wherein
the display device includes:
a first integrated circuit including a sensor value obtaining circuit configured to obtain a sensor value that changes depending on a degree of approach of a detection object to the touch panel; and
a second integrated circuit including a display drive circuit configured to drive the plurality of pixel circuits while performing a characteristic detection process to compensate for degradation of the drive transistor or the display element, the characteristic detection process including a process of measuring a current flowing through each of the plurality of pixel circuits; and a display control circuit configured to control operation of the display drive circuit such that the characteristic detection process is performed row-by-row and image display on the display unit is performed using video signals corrected based on current values obtained by performing the characteristic detection process,
the method including:
a touch determining step of determining whether or not there is touch on the display unit, based on the sensor value obtained by the sensor value obtaining circuit in the first integrated circuit; and
a touch determination signal transmitting step of transmitting a touch determination signal indicating a result of determination made in the touch determining step from the first integrated circuit to the second integrated circuit,
when the touch determination signal transmitted to the second integrated circuit indicates that there is touch on the display unit, the display control circuit controls operation of the display drive circuit such that the characteristic detection process of usual is stopped until the touch determination signal indicating that there is no touch on the display unit is transmitted to the second integrated circuit, and
when the touch determination signal transmitted to the second integrated circuit indicates that there is no touch on the display unit, the display control circuit controls operation of the display drive circuit such that the characteristic detection process of usual is performed.

Effects of the Invention

According to several embodiments of the present disclosure, there is provided a determination circuit that determines whether or not a characteristic detection process is influenced by touch, based on a touch position and a monitoring target row. When the determination circuit determines that the characteristic detection process is influenced by touch, the characteristic detection process of usual is stopped until the next time the determination circuit determines that the characteristic detection process is not influenced by touch. That is, only when it is determined by the determination circuit that the characteristic detection process is not influenced by touch, the characteristic detection process of usual is performed. Therefore, a process of compensating for degradation of a drive transistor or a display element (a display element driven by a current) is not performed using data that is influenced by a temperature increase caused by touch. Thus, degradation of the drive transistor or the display element is appropriately compensated for. Accordingly, a display device equipped with a touch panel suppresses degradation in display quality caused by touch.

According to several other embodiments of the present disclosure, there is provided a touch determination circuit that determines whether or not there is touch on a display unit, based on a sensor value obtained by a sensor value obtaining circuit. A touch determination signal indicating a result of determination made by the touch determination circuit is transmitted from a first integrated circuit including the touch determination circuit to a second integrated circuit including a display control circuit. When the touch determination signal transmitted to the second integrated circuit indicates that there is touch on the display unit, the characteristic detection process of usual is stopped until a touch determination signal indicating that there is no touch on the display unit is transmitted to the second integrated circuit. That is, only when there is no touch on the display unit, the characteristic detection process of usual is performed. Therefore, a process of compensating for degradation of a drive transistor or a display element (a display element driven by a current) is not performed using data that is influenced by a temperature increase caused by touch. Thus, degradation of the drive transistor or the display element is appropriately compensated for.

In addition, since only the touch determination signal is to be transmitted from the first integrated circuit to the second integrated circuit, memory space, etc., for holding data required for a process of controlling performance of the characteristic detection process do not need to be prepared inside the second integrated circuit. Accordingly, a display device equipped with a touch panel suppresses degradation in display quality caused by touch, even if the second integrated circuit including the display control circuit does not hold a memory, etc., having enough free space.

BRIEF DESCRIPTION OF THE DRAWINGS

FIG. 10 is a diagram for describing obtaining of a sensor value for each node in the first embodiment.

FIG. 34 is a diagram for describing an example of a determination as to whether or not the characteristic detection process is influenced by touch in the third embodiment.

FIG. 35 is a diagram for describing an example of a determination as to whether or not the characteristic detection process is influenced by touch in the third embodiment.

FIG. 42 is a diagram schematically showing a counter provided for each touch coordinates in a third variant of the third embodiment.

FIG. 43 is a diagram for describing a signal transmitted from the touch controller to the timing controller in a fourth embodiment.

FIG. 44 is a waveform diagram for describing a touch determination signal in the fourth embodiment.

MODES FOR CARRYING OUT THE INVENTION

With reference to the accompanying drawings, embodiments will be described below. Note that in the following description, it is assumed that m and n are integers greater than or equal to 2, i is an integer between 1 and n, inclusive, and j is an integer between 1 and m, inclusive.

1. First Embodiment

<1.1 Overall Configuration>

Figure 2:
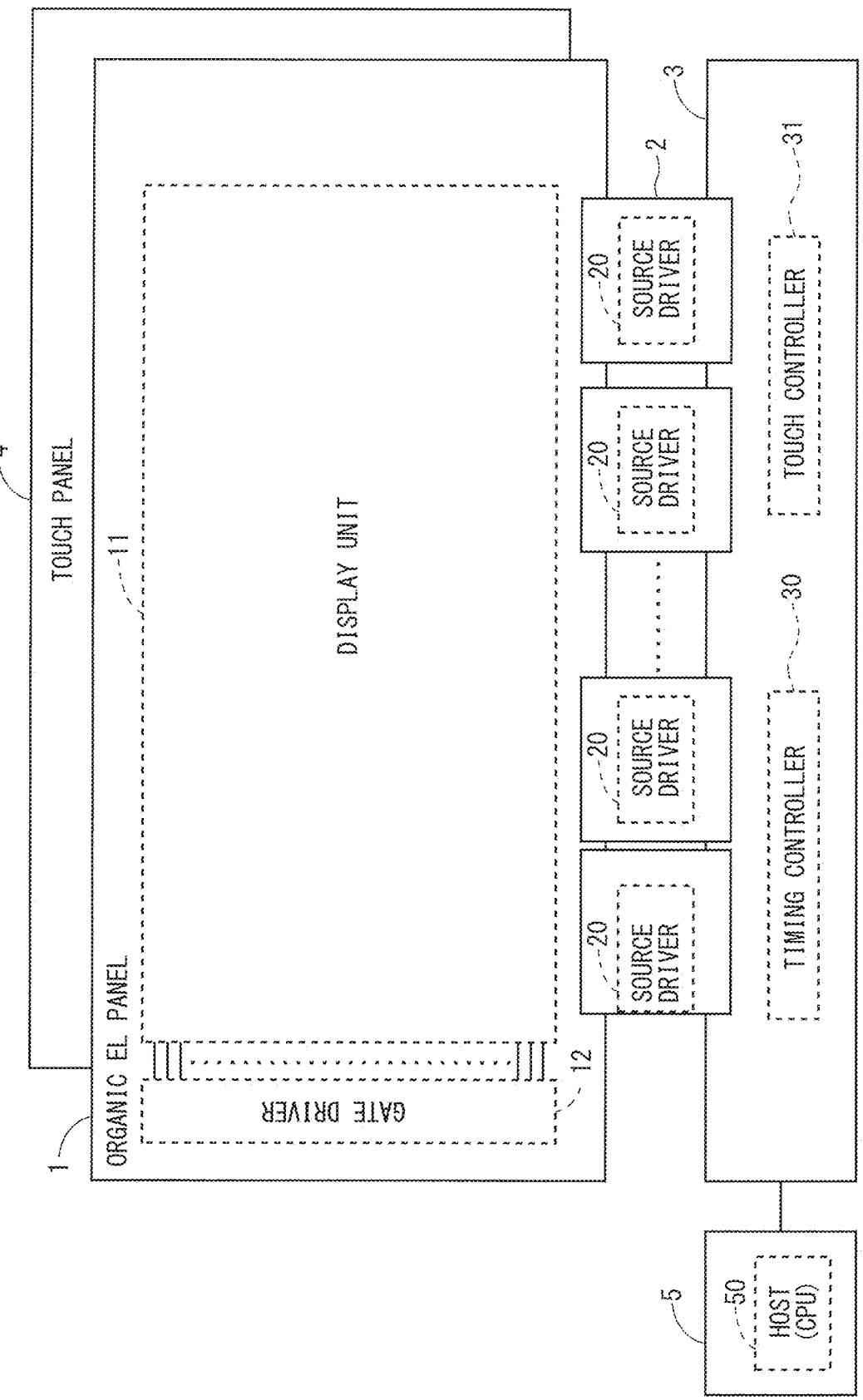
FIG. 2 is a block diagram showing an overall configuration of an active matrix-type organic EL display device according to the first embodiment.

FIG. 2 is a block diagram showing an overall configuration of an active matrix-type organic EL display device according to a first embodiment. The organic EL display device includes an organic EL panel 1 including a display unit 11 and a gate driver 12; a touch panel 4; source drivers 20; a timing controller 30; a touch controller 31; and a host (CPU) 50. Each of the source drivers 20 is mounted on, for example, an FPC 2. The timing controller 30 and the touch controller 31 are mounted on a control board 3. The host (CPU) 50 is mounted on a CPU board 5.

The display unit 11 is a region in which components (various wiring lines, transistors, organic EL elements, etc.) for displaying an image are provided. The touch panel 4 is provided on a surface of the organic EL panel 1. The gate driver 12 drives scanning signal lines and monitoring control lines (described later) disposed in the display unit 11. The source drivers 20 drive data signal lines (described later) disposed in the display unit 11. By the gate driver 12 and the source drivers 20 operating, an image is displayed on the display unit 11.

The timing controller 30 is an integrated circuit including a circuit mainly for controlling image display on the display unit 11. The touch controller 31 is an integrated circuit including a circuit mainly for controlling touch detection. Note that a first integrated circuit is implemented by the touch controller 31, and a second integrated circuit is implemented by the timing controller 30. The host 50 transmits image data DAT to the timing controller 30, based on a touch position.

Note that, in the present embodiment, the gate driver 12 is formed on a board that constitutes the organic EL panel 1. That is, the gate driver 12 is monolithically formed. Note, however, that a configuration in which the gate driver 12 is not monolithically formed can also be adopted. In addition, although the timing controller 30 and the touch controller 31 are mounted on the same board in the present embodiment, a configuration in which the timing controller 30 and the touch controller 31 are mounted on different boards can also be adopted.

Figure 3:
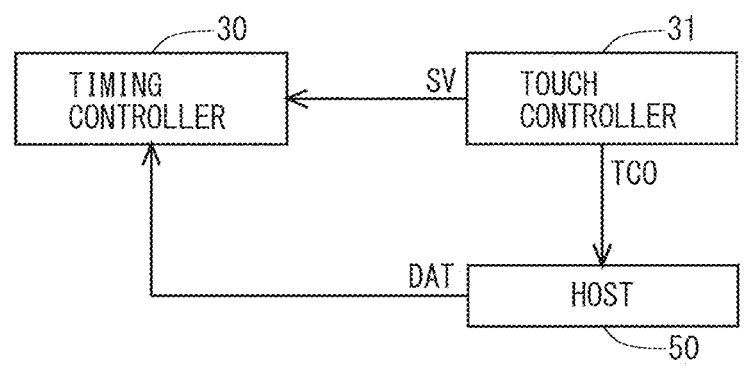
FIG. 3 is a diagram for describing a relationship between a timing controller, a touch controller, and a host in the first embodiment.

FIG. 3 is a diagram for describing a relationship between the timing controller 30, the touch controller 31, and the host 50. Touch coordinate data TCO representing a touch position is transmitted from the touch controller 31 to the host 50. Then, the host 50 generates image data DAT based on the touch coordinate data TCO (i.e., based on the touch position), and transmits the image data DAT to the timing controller 30. In addition, in the present embodiment, a process of controlling performance of the characteristic detection process based on touch conditions on the display unit 11 is performed in the timing controller 30. In order to realize this, data on sensor values SV (described later) required to identify a touch position is transmitted from the touch controller 31 to the timing controller 30. Note that since identification of a touch position is also performed in the timing controller 30, instead of transmitting touch coordinate data TCO from the touch controller 31 to the host 50, data representing a touch position may be transmitted from the timing controller 30 to the host 50.

<1.2 Configuration for Image Display>

Figure 1:
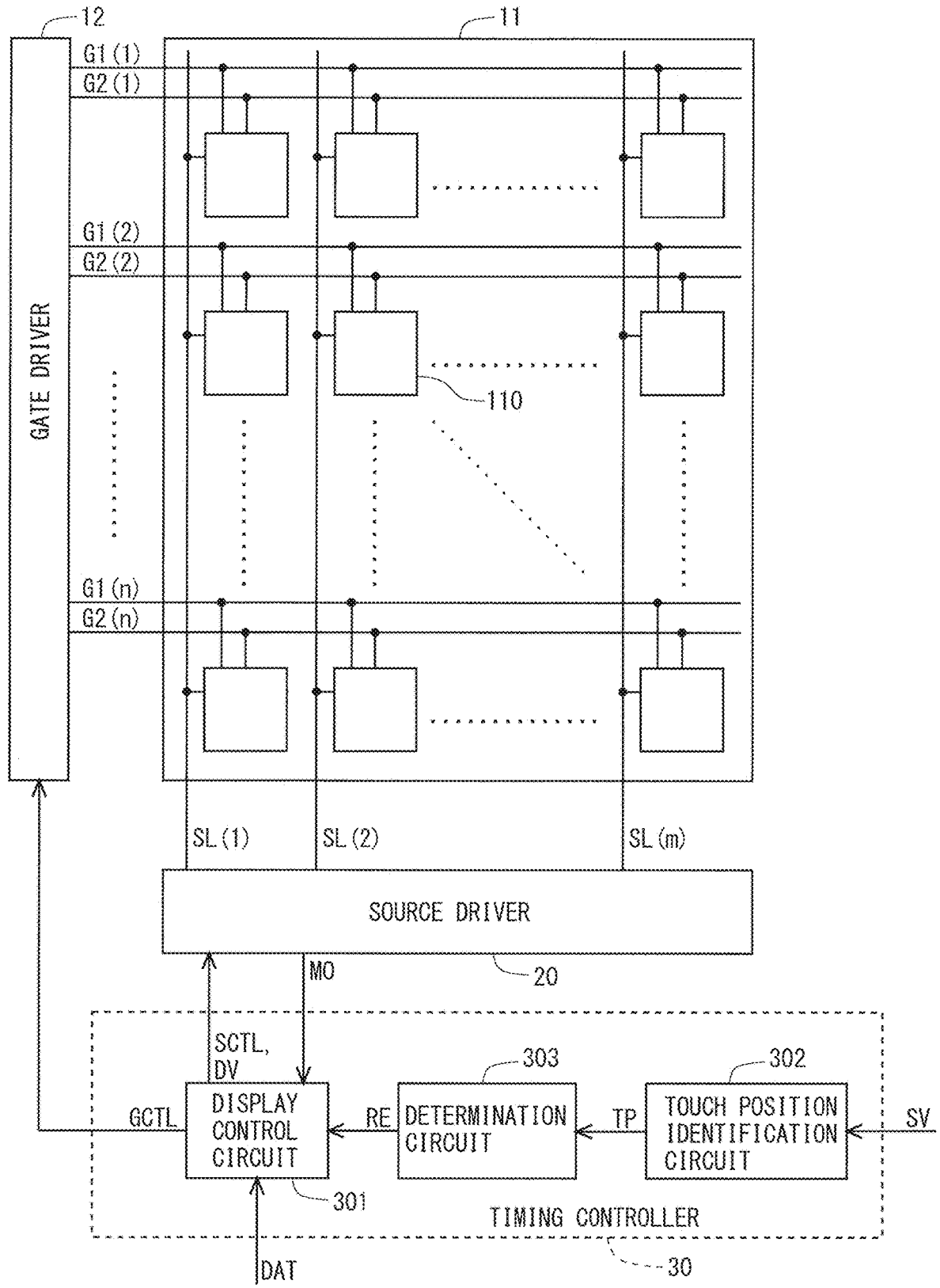
FIG. 1 is a block diagram showing a configuration for image display in a first embodiment.

FIG. 1 is a block diagram showing a configuration for image display in the present embodiment. As shown in FIG. 1, in the display unit 11 there are disposed m data signal lines SL(1) to SL(m) and n scanning signal lines G1(1) to G1(n) intersecting the m data signal lines SL(1) to SL(m). In addition, in the display unit 11 there are disposed n monitoring control lines G2(1) to G2(n) so as to have a one-to-one correspondence with the n scanning signal lines G1(1) to G1(n). The scanning signal lines G1(1) to G1(n) and the monitoring control lines G2(1) to G2(n) are parallel to each other. Furthermore, in the display unit 11 there are provided pixel circuits 110 of n rows×m columns at intersections of the n scanning signal lines G1(1) to G1(n) and the m data signal lines SL(1) to SL(m). That is, in the display unit 11 there is formed a pixel matrix of n rows×m columns. In addition, in the display unit 11 there are disposed a high-level power line (not shown) that supplies a high-level power supply voltage ELVDD and a low-level power line (not shown) that supplies a low-level power supply voltage ELVSS.

Note that in the following description, when the m data signal lines SL(1) to SL(m) do not need to be distinguished from each other, the data signal line is simply given reference character SL. Likewise, when the n scanning signal lines G1(1) to G1(n) do not need to be distinguished from each other, the scanning signal line is simply given reference character G1, and when the n monitoring control lines G2(1) to G2(n) do not need to be distinguished from each other, the monitoring control line is simply given reference character G2.

The timing controller 30 includes a display control circuit 301, a touch position identification circuit 302, and a determination circuit 303.

The operation of each component shown in FIG. 1 will be described below. The touch position identification circuit 302 identifies a touch position on the display unit 11, based on data on sensor values SV transmitted from the touch controller 31. The touch position identification circuit 302 outputs touch position information TP indicating the touch position. Note that the touch position information TP also includes information indicating whether or not there is touch at any position on the display unit 11.

The determination circuit 303 determines whether or not the characteristic detection process is influenced by touch, based on the touch position indicated by the touch position information TP outputted from the touch position identification circuit 302 and a monitoring target row which is a row to be subjected to the characteristic detection process. Note that data representing a row that is currently set as the monitoring target row is held in, for example, a memory (not shown) in the display control circuit 301.

The display control circuit 301 controls the operation of the gate driver 12 and the source drivers 20 such that the characteristic detection process is performed row-by-row and image display on the display unit 11 is performed using digital video signals DV corrected based on current values obtained by performing the characteristic detection process. Specifically, the display control circuit 301 receives image data DAT transmitted from the host 50 and monitoring data MO transmitted from the source drivers 20, and outputs digital video signals DV, gate control signals GCTL that control the operation of the gate driver 12, and source control signals SCTL that control the operation of the source drivers 20. The gate control signals GCTL include a gate start pulse signal, a gate clock signal, etc. The source control signals SCTL include a source start pulse signal, a source clock signal, a latch strobe signal, etc. Note that the digital video signals DV for image display are generated by performing a compensation computation process on the image data DAT based on the monitoring data MO. The display control circuit 301 also controls performance of the characteristic detection process, based on a determination result (a determination result as to whether or not the characteristic detection process is influenced by touch) RE provided from the determination circuit 303. Note that a detailed description of the control of performance of the characteristic detection process will be made later.

The gate driver 12 is connected to the scanning signal lines G1(1) to G1(n) and the monitoring control lines G2(1) to G2(n). The gate driver 12 applies scanning signals to the scanning signal lines G1(1) to G1(n) and applies monitoring control signals to the monitoring control lines G2(1) to G2(n), based on the gate control signals GCTL outputted from the display control circuit 301.

Figure 4:
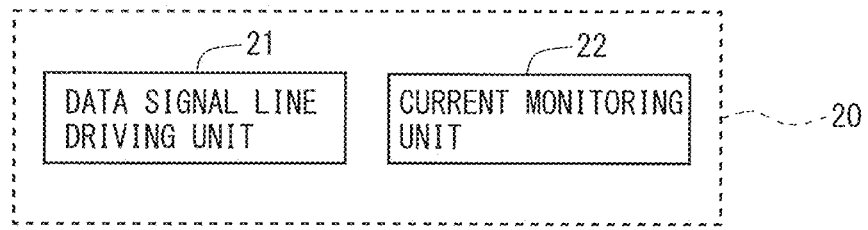
FIG. 4 is a diagram for describing functions of a source driver in the first embodiment.

The source drivers 20 are connected to the data signal lines SL(1) to SL(m). The source drivers 20 selectively perform the operation of driving the data signal lines SL(1) to SL(m) (the operation of applying data signals to the data signal lines SL(1) to SL(m)) and the operation of measuring currents flowing through the data signal lines SL(1) to SL(m), based on the digital video signals DV and the source control signals SCTL which are outputted from the display control circuit 301. That is, as shown in FIG. 4, the source drivers 20 functionally include a portion that functions as a data signal line driving unit 21 that drives the data signal lines SL(1) to SL(m); and a portion that functions as a current monitoring unit 22 that measures currents flowing from the pixel circuits 110 to the data signal lines SL(1) to SL(m) and currents flowing from the data signal lines SL(1) to SL(m) to the pixel circuits 110. The current monitoring unit 22 measures currents flowing through the data signal lines SL(1) to SL(m), and outputs monitoring data MO generated based on measurement values. As such, the data signal lines SL(1) to SL(m) are not only used to transmit data signals for image display, but are also used as signal lines for allowing, upon the characteristic detection process, a current based on a characteristic of a drive transistor or an organic EL element to flow therethrough.

By thus applying the scanning signals to the scanning signal lines G1(1) to G1(n), applying the monitoring control signals to the monitoring control lines G2(1) to G2(n), and applying the data signals to the data signal lines SL(1) to SL(m), an image based on the image data DAT is displayed on the display unit 11. In addition, the characteristic detection process is performed and a compensation computation process is performed on the image data DAT based on the monitoring data MO, and thus, degradation of the drive transistors or the organic EL elements is compensated for.

Note that, in the present embodiment, a display drive circuit is implemented by the gate driver 12 and the source drivers 20.

Next, the pixel circuits 110 and the source driver 20 will be described in detail. The source driver 20 performs the following operation when functioning as the data signal line driving unit 21. The source driver 20 receives source control signals SCTL outputted from the display control circuit 301 and applies, as data signals, video signal voltages (voltages for image display) generated based on target luminance to the respective m data signal lines SL(1) to SL(m). During this time, the source driver 20 sequentially holds digital video signals DV indicating voltages to be applied to the respective data signal lines SL, at timing at which a pulse of a source clock signal is generated, triggered by a pulse of a source start pulse signal. Then, the held digital video signals DV each are converted into an analog voltage at timing at which a pulse of a latch strobe signal is generated. The converted analog voltages are simultaneously applied as data signals to all data signal lines SL(1) to SL(m). When the source driver 20 functions as the current monitoring unit 22, the source driver 20 applies monitoring voltages (voltages for measuring currents) to the data signal lines SL(1) to SL(m), and thereby obtains, as analog data, currents flowing through the data signal lines SL(1) to SL(m), and converts the analog data into digital data. The converted digital data is outputted as monitoring data MO from the source driver 20.

Figure 5:
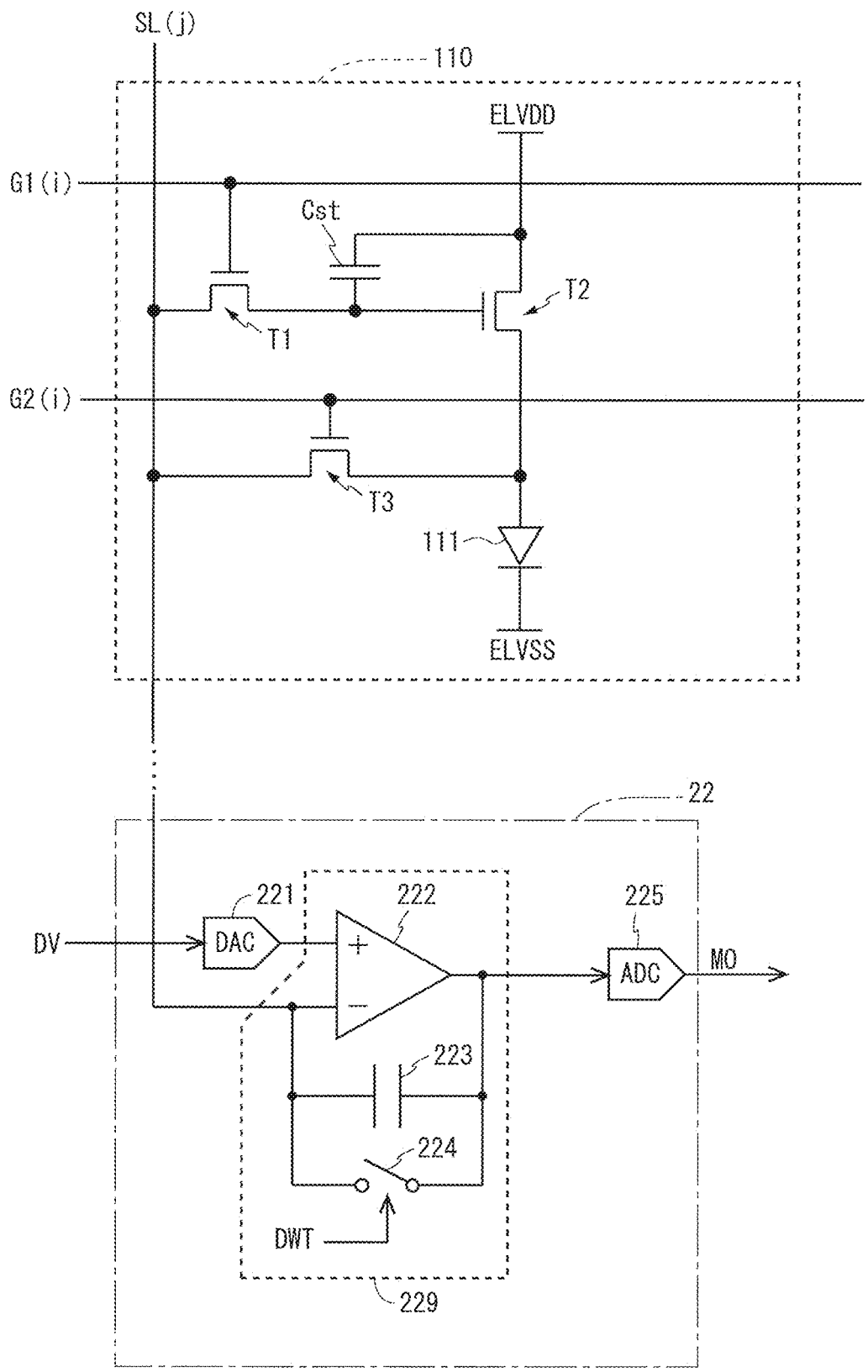
FIG. 5 is a circuit diagram showing a pixel circuit and a part of the source driver (a portion that functions as a current monitoring unit) in the first embodiment.

FIG. 5 is a circuit diagram showing a pixel circuit 110 and a part of the source driver 20 (a portion that functions as the current monitoring unit 22). Note that FIG. 5 shows a pixel circuit 110 in an ith row and a jth column and a portion of the source driver 20 corresponding to a data signal line SL(j) in the jth column. The pixel circuit 110 includes one organic EL element 111 serving as a display element, three transistors T1 to T3, and one capacitor Cst. The transistor T1 functions as an input transistor that selects a pixel, the transistor T2 functions as a drive transistor that controls supply of a current (drive current) to the organic EL element 111, and the transistor T3 functions as a monitoring control transistor that controls whether to perform current measurement for detecting a characteristic of the drive transistor T2 or the organic EL element 111.

The input transistor T1 is connected at its control terminal to a scanning signal line G1(i), connected at its first conductive terminal to the data signal line SL(j), and connected at its second conductive terminal to a control terminal of the drive transistor T2 and one end of the capacitor Cst. The drive transistor T2 is connected at its control terminal to the second conductive terminal of the input transistor T1 and the one end of the capacitor Cst, connected at its first conductive terminal to a high-level power line and the other end of the capacitor Cst, and connected at its second conductive terminal to a first conductive terminal of the monitoring control transistor T3 and an anode terminal of the organic EL element 111. The monitoring control transistor T3 is connected at its control terminal to a monitoring control line G2(i), connected at its first conductive terminal to the second conductive terminal of the drive transistor T2 and the anode terminal of the organic EL element 111, and connected at its source terminal to the data signal line SL(j). The capacitor Cst is connected at its one end to the control terminal of the drive transistor T2 and the second conductive terminal of the input transistor T1, and connected at its other end to the first conductive terminal of the drive transistor T2 and the high-level power line. The organic EL element 111 is connected at its anode terminal to the second conductive terminal of the drive transistor T2 and the first conductive terminal of the monitoring control transistor T3, and connected at its cathode terminal to the low-level power line.

As shown in FIG. 5, the current monitoring unit 22 includes a DA converter (DAC) 221, an operational amplifier 222, a capacitor 223, a switch 224, and an AD converter (ADC) 225. The operational amplifier 222, the capacitor 223, and the switch 224 form a current/voltage converting unit 229. Note that the current/voltage converting unit 229 and the DA converter 221 also function as components of the data signal line driving unit 21.

A digital video signal DV is provided to an input terminal of the DA converter 221. The DA converter 221 converts the digital video signal DV into an analog voltage. The analog voltage is a video signal voltage or a monitoring voltage. An output terminal of the DA converter 221 is connected to a non-inverting input terminal of the operational amplifier 222. Thus, a video signal voltage or a monitoring voltage is provided to the non-inverting input terminal of the operational amplifier 222. An inverting input terminal of the operational amplifier 222 is connected to the data signal line SL(j). The switch 224 is provided between the inverting input terminal and output terminal of the operational amplifier 222. The capacitor 223 is provided in parallel to the switch 224 and between the inverting input terminal and output terminal of the operational amplifier 222. An input and output control signal DWT included in the source control signals SCTL is provided to a control terminal of the switch 224. The output terminal of the operational amplifier 222 is connected to an input terminal of the AD converter 225.

In a configuration such as that described above, when the input and output control signal DWT is at a high level, the switch 224 is in an on state, and a short-circuit state occurs between the inverting input terminal and output terminal of the operational amplifier 222. At this time, the operational amplifier 222 functions as a buffer amplifier. By this, a voltage (a video signal voltage or a monitoring voltage) provided to the non-inverting input terminal of the operational amplifier 222 is applied to the data signal line SL(j). When the input and output control signal DWT is at a low level, the switch 224 is an off state, and the inverting input terminal and output terminal of the operational amplifier 222 are connected to each other through the capacitor 223. At this time, the operational amplifier 222 and the capacitor 223 function as an integrator circuit. By this, an output voltage from the operational amplifier 222 is a voltage based on a current flowing through the data signal line SL(j). The AD converter 225 converts the output voltage from the operational amplifier 222 into a digital value. Data obtained after the conversion is sent as monitoring data MO to the display control circuit 301.

Note that although, in the present embodiment, it is configured such that a signal line for supplying a data signal and a signal line for measuring a current are shared, the configuration is not limited thereto. A configuration can also be adopted in which a signal line for supplying a data signal and a signal line for measuring a current are provided independently of each other. In addition, for the configuration of the pixel circuit 110, too, other configurations than the configuration shown in FIG. 5 can also be adopted. That is, there are no particular limitations on specific circuit configurations of the current monitoring unit 22 and the pixel circuit 110.

<1.3 Configuration for Touch Detection>

Figure 6:
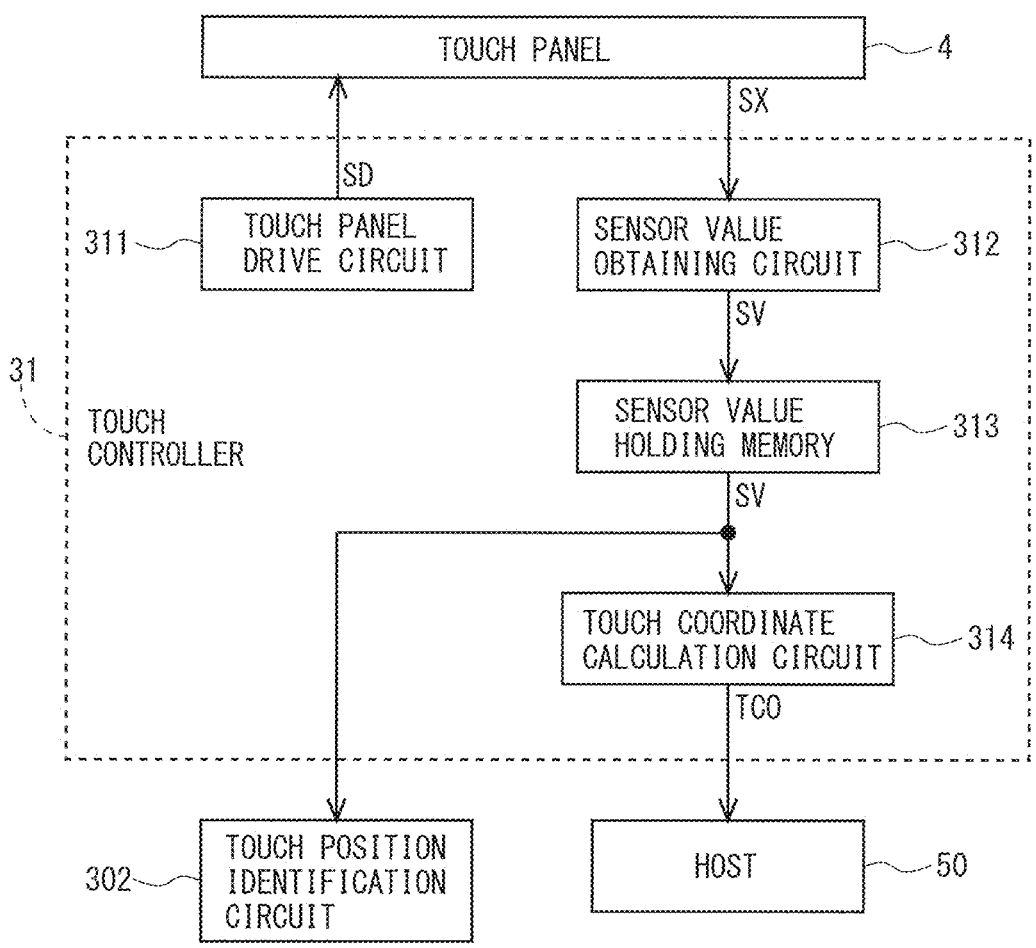
FIG. 6 is a block diagram showing a configuration for touch detection in the first embodiment.

FIG. 6 is a block diagram showing a configuration for touch detection in the present embodiment. As shown in FIG. 6, the touch controller 31 includes a touch panel drive circuit 311, a sensor value obtaining circuit 312, a sensor value holding memory 313, and a touch coordinate calculation circuit 314. The touch panel drive circuit 311 provides a drive signal SD for performing touch detection to the touch panel 4. The sensor value obtaining circuit 312 obtains a sensor value SV for each node which is a unit of obtaining data for touch detection, based on a detection signal SX provided from the touch panel 4. The sensor value SV is a value that changes depending on the degree of approach of a detection object (a finger, a glove, etc.) to the touch panel 4. Note that the detection signal SX provided from the touch panel 4 is an analog voltage, and thus, the sensor value obtaining circuit 312 includes an A/D converter. The sensor values SV obtained by the sensor value obtaining circuit 312 are stored in the sensor value holding memory 313. The touch coordinate calculation circuit 314 identifies a touch position on the display unit 11, based on the sensor values SV stored in the sensor value holding memory 313. Then, touch coordinate data TCO representing the touch position identified by the touch coordinate calculation circuit 314 is transmitted to the host 50. In addition, data on the sensor values SV stored in the sensor value holding memory 313 is transmitted to the touch position identification circuit 302 in the timing controller 30. In order to realize this, there is provided a wiring line for transmitting the data on the sensor values SV from the touch controller 31 to the timing controller 30. As an interface between the touch controller 31 and the timing controller 30, for example, an SPI interface or an I2C interface is adopted.

Figure 7:
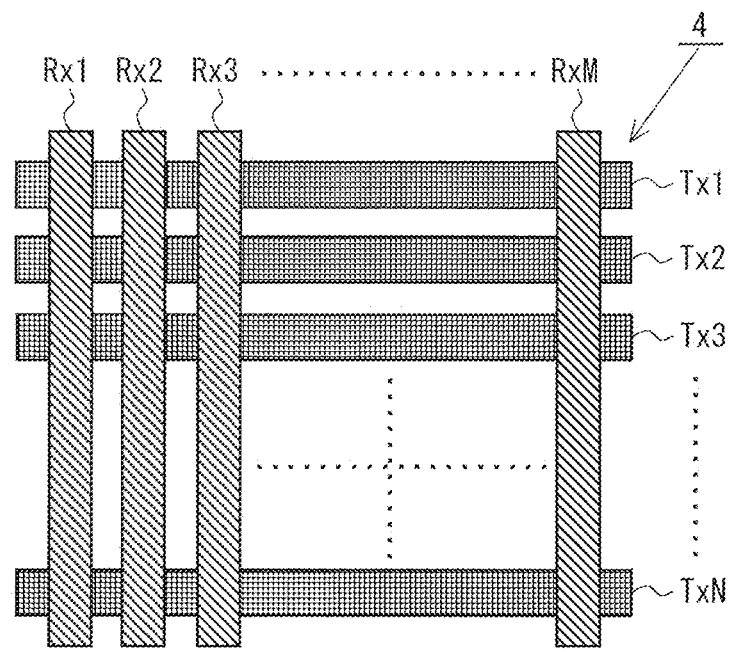
FIG. 7 is a diagram for describing a configuration of a touch panel (first example) in the first embodiment.

The configuration of the touch panel 4 is not particularly limited, but here, three exemplary configurations (first to third examples) will be described. FIG. 7 is a plan view of a touch panel 4 according to a first example. The touch panel 4 includes, as sensor electrodes, N drive lines (transmitting-side electrodes) Tx1 to TxN and M sensing lines (receiving-side electrodes) Rx1 to RxM. The drive lines Tx1 to TxN are arranged in parallel to each other. The sensing lines Rx1 to RxM are arranged in parallel to each other. The drive lines Tx1 to TxN and the sensing lines Rx1 to RxM intersect each other. In this example, one node is implemented by, for example, one point of intersection of any of the drive lines Tx1 to TxN and any of the sensing lines Rx1 to RxM.

Figure 8:
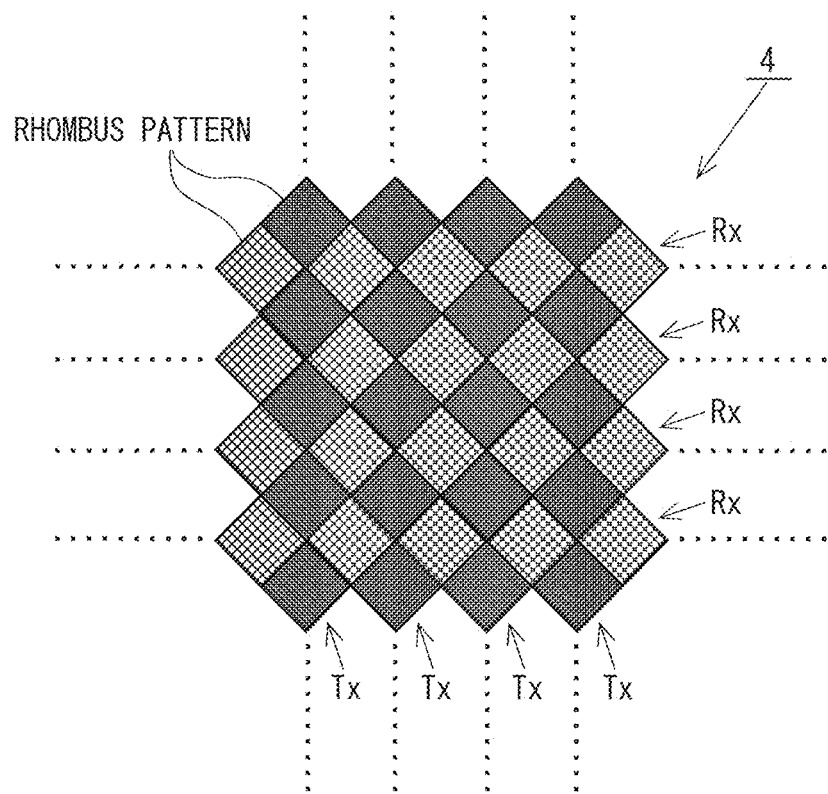
FIG. 8 is a diagram for describing a configuration of a touch panel (second example) in the first embodiment.

FIG. 8 is a plan view of a touch panel 4 according to a second example. The touch panel 4 includes, as sensor electrodes, a plurality of transmitting-side electrodes Tx in which a plurality of rhombus-shaped pattern are connected in a vertical direction; and a plurality of receiving-side electrodes Rx in which a plurality of rhombus-shaped pattern are connected in a horizontal direction. Regarding this, it is possible to adopt a configuration in which the transmitting-side electrodes Tx and the receiving-side electrodes Rx are formed in different layers, a configuration in which the transmitting-side electrodes Tx and the receiving-side electrodes Rx are formed in the same layer, a configuration called a metal mesh type (a configuration in which silver or copper is used instead of using a known ITO film), etc. In this example, one node is implemented by, for example, one point of intersection of a transmitting-side electrode Tx and a receiving-side electrode Rx. Note that the configuration shown in FIG. 8 is called a "diamond pattern".

Figure 9:
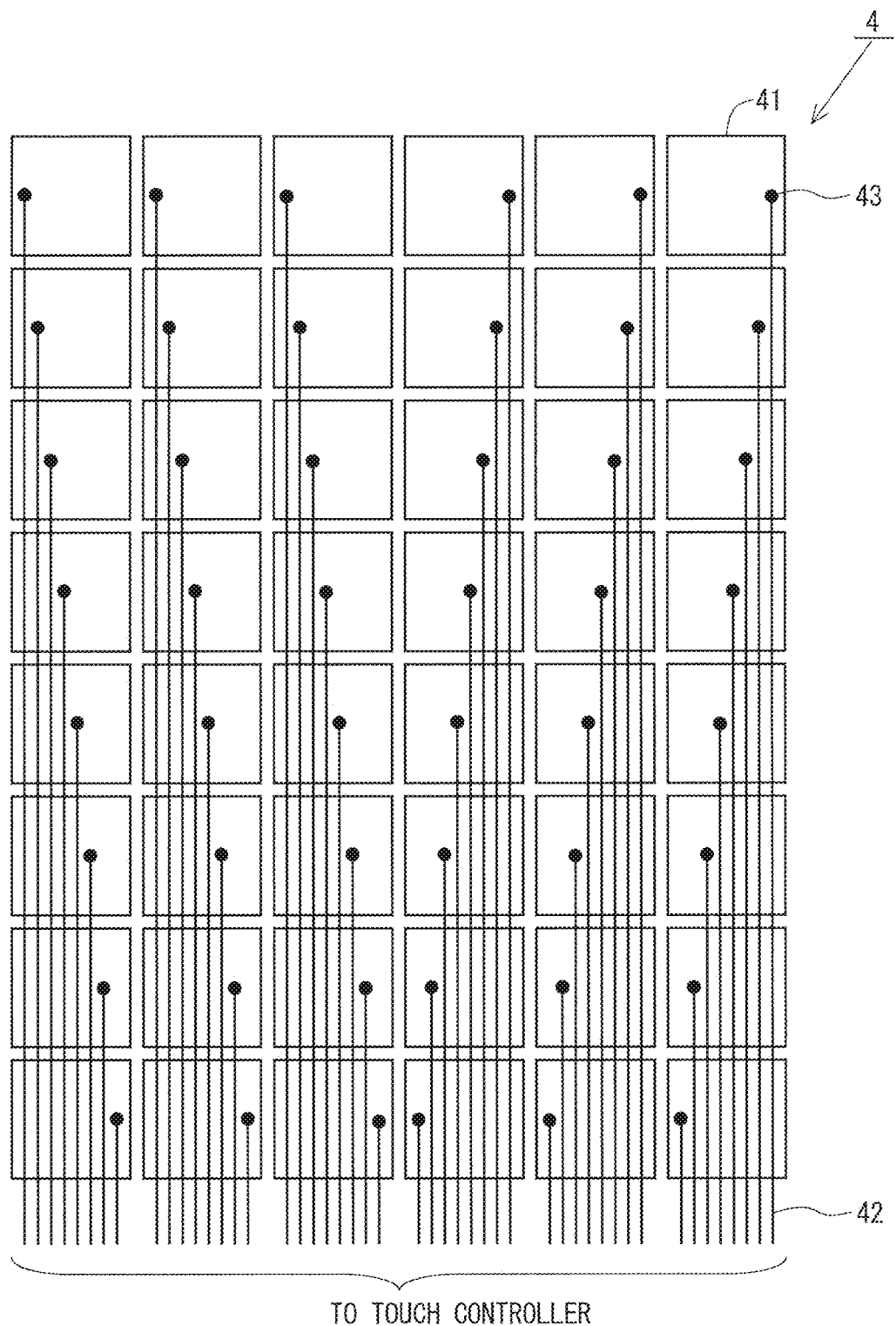
FIG. 9 is a diagram for describing a configuration of a touch panel (third example) in the first embodiment.

FIG. 9 is a plan view of a touch panel 4 according to a third example. The touch panel 4 includes a plurality of rectangular sensor electrodes 41 arranged in matrix form. The plurality of sensor electrodes 41 are not electrically connected to each other. Each sensor electrode 41 is connected to the touch controller 31 through a touch detection wiring line 42. In addition, as shown in FIG. 9, there is provided a contact portion 43 for connecting each sensor electrode 41 to a corresponding touch detection wiring line 42.

Whichever configuration is adopted as the configuration of the touch panel 4, for example, as shown in FIG. 10, a sensor value SV for each node is obtained based on a detection signal SX (in FIG. 10, one rectangle corresponds to one node).

<1.4 Characteristic Detection Process>

Figure 11:
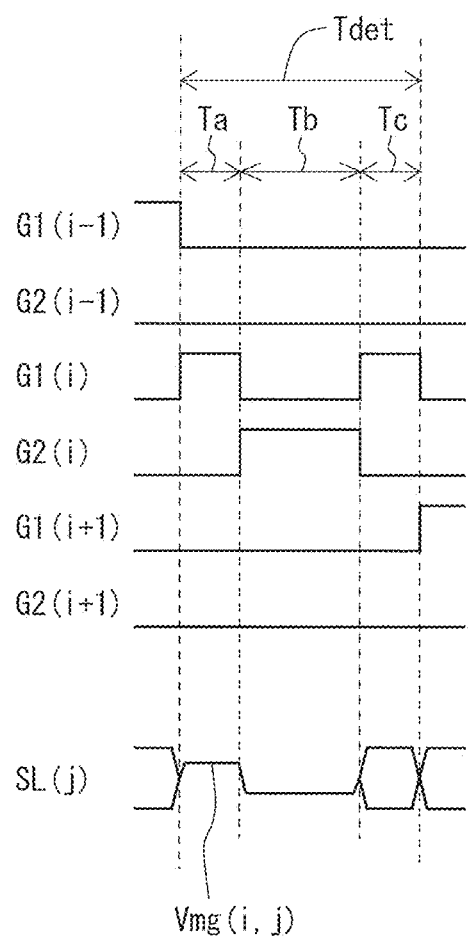
FIG. 11 is a timing chart for describing a driving method for performing a characteristic detection process in the first embodiment.

Next, a characteristic detection process will be described. FIG. 11 is a timing chart for describing a driving method for performing the characteristic detection process. Note that FIG. 11 shows an example in which the characteristic detection process is performed for an ith row. In FIG. 11, a period indicated by reference character Tdet is a characteristic detection period. The characteristic detection period Tdet includes a period during which preparation for detecting a TFT characteristic or an OLED characteristic is performed in a monitoring target row (a row to be subjected to the characteristic detection process) (hereinafter, this period is referred to as "detection preparation period".) Ta; a current measurement period Tb during which a current is actually measured; and a period during which writing of a video signal voltage (a voltage corresponding to a normal display image) is performed in the monitoring target row (hereinafter, this period is referred to as "video signal voltage writing period".) Tc.

During the detection preparation period Ta, a scanning signal line G1(i) is brought into an active state, and a monitoring control line G2(i) is maintained in a non-active state. By this, the input transistor T1 is in an on state, and the monitoring control transistor T3 is maintained in an off state. In addition, during the detection preparation period Ta, a monitoring voltage Vmg(i, j) is applied to a data signal line SL(j). Note that the monitoring voltage Vmg(i, j) does not indicate a given fixed voltage, and the magnitude of the monitoring voltage Vmg(i, j) differs between when a TFT characteristic is detected and when an OLED characteristic is detected. That is, the monitoring voltage used here is a concept including both a monitoring voltage for detecting a TFT characteristic (hereinafter, referred to as "TFT characteristic measurement voltage".) and a monitoring voltage for detecting an OLED characteristic (hereinafter, referred to as "OLED characteristic measurement voltage".). When the monitoring voltage Vmg(i, j) is the TFT characteristic measurement voltage, the drive transistor T2 is in an on state. When the monitoring voltage Vmg(i, j) is the OLED characteristic measurement voltage, the drive transistor T2 is maintained in an off state.

Figure 12:
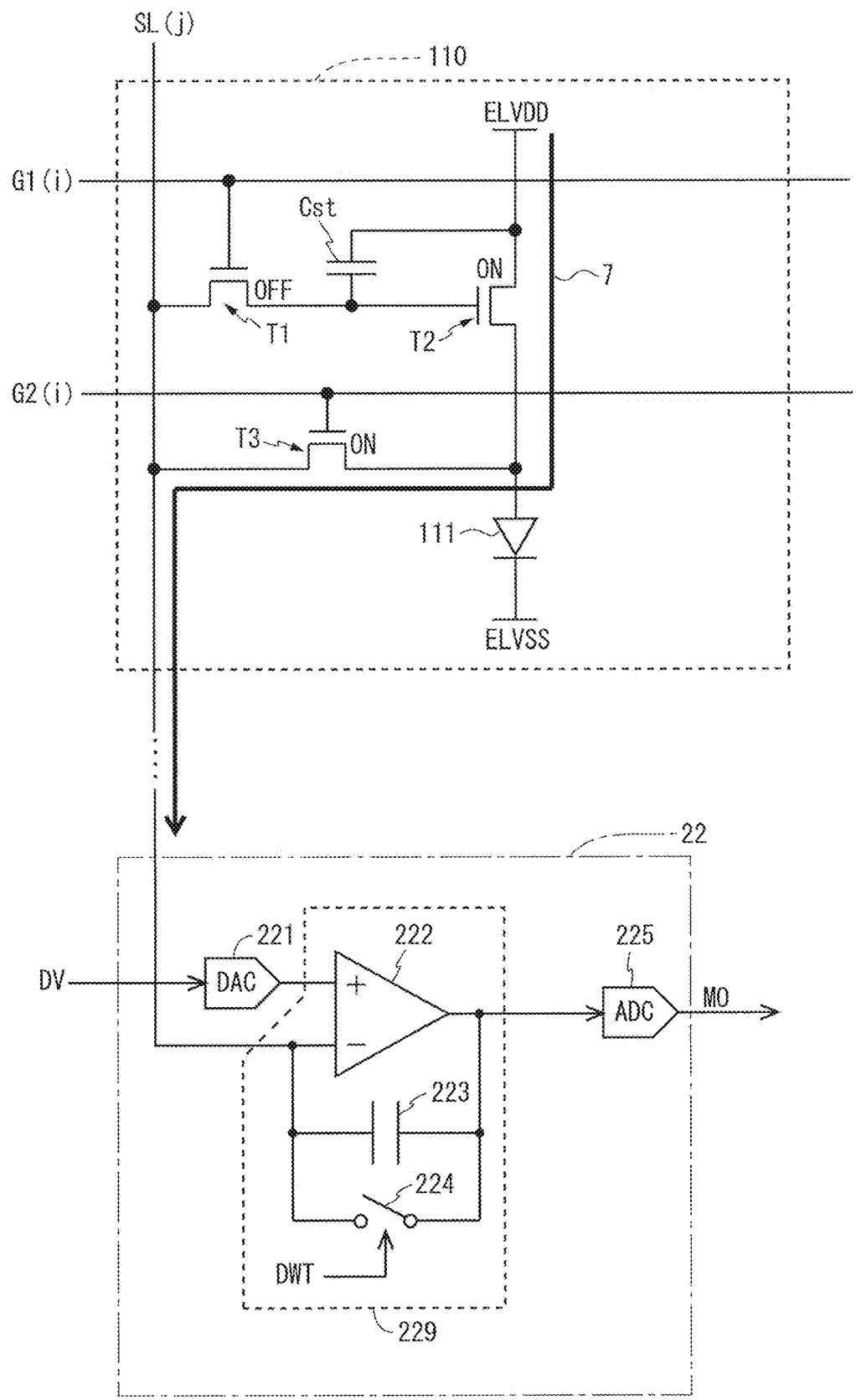
FIG. 12 is a diagram for describing the flow of a current during a current measurement period when a characteristic of a drive transistor is detected in the first embodiment.
Figure 13:
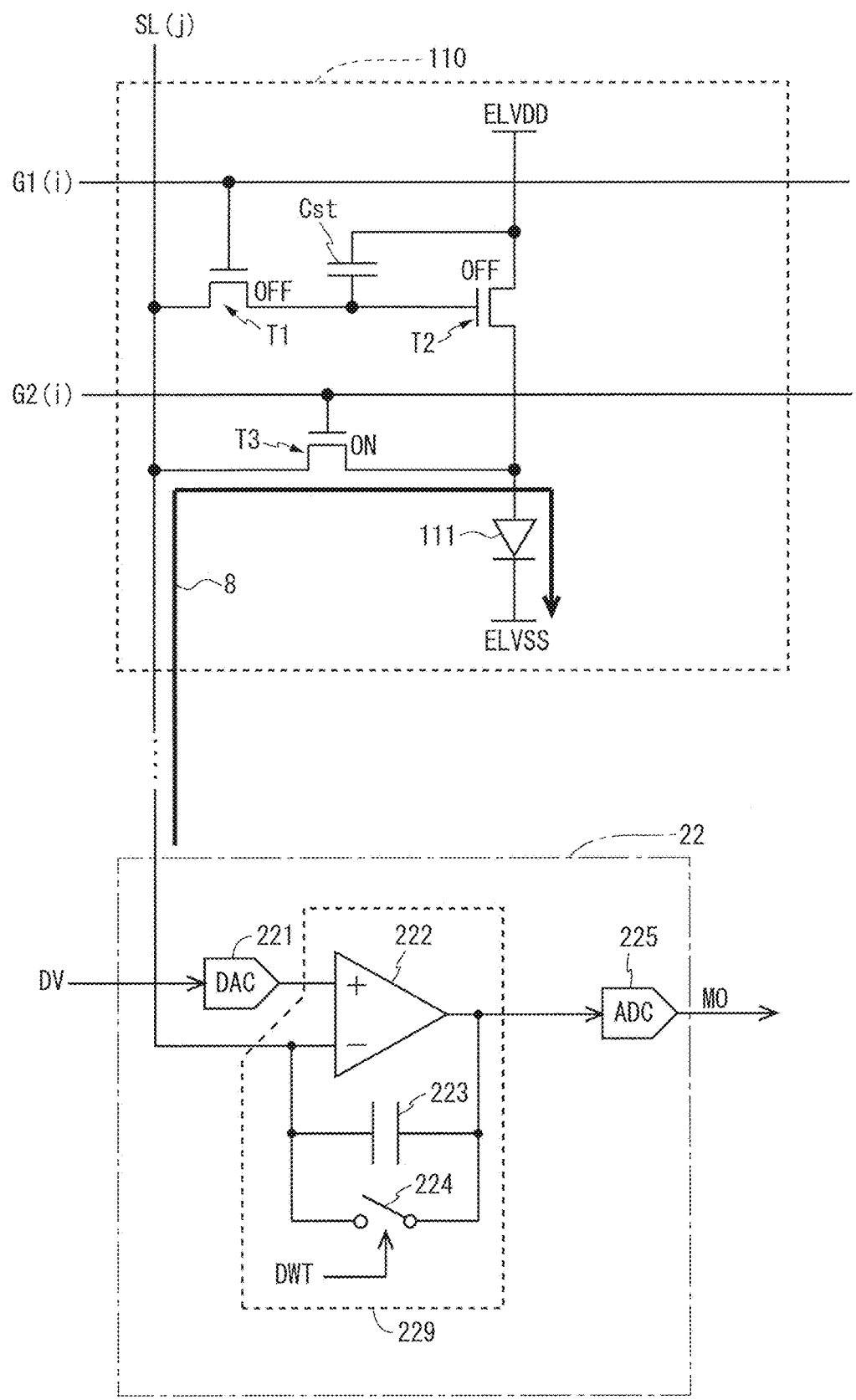
FIG. 13 is a diagram for describing the flow of a current during a current measurement period when a characteristic of an organic EL element is detected in the first embodiment.

During the current measurement period Tb, the scanning signal line G1(i) is brought into a non-active state and the monitoring control line G2(i) is brought into an active state. By this, the input transistor T1 is in an off state and the monitoring control transistor T3 is in an on state. Here, when the monitoring voltage Vmg(i, j) is the TFT characteristic measurement voltage, the drive transistor T2 is maintained in an on state and a current does not flow through the organic EL element 111. Thus, as indicated by an arrow given reference character 7 in FIG. 12, a current flowing through the drive transistor T2 is outputted to the data signal line SL(j) through the monitoring control transistor T3. In this state, the current flowing through the data signal line SL(j) is measured by the current monitoring unit 22 in the source driver 20. On the other hand, when the monitoring voltage Vmg(i, j) is the OLED characteristic measurement voltage, the drive transistor T2 is maintained in an off state and a current flows through the organic EL element 111. That is, as indicated by an arrow given reference character 8 in FIG. 13, a current flows through the organic EL element 111 from the data signal line SL(j) through the monitoring control transistor T3. In this state, the current flowing through the data signal line SL(j) is measured by the current monitoring unit 22 in the source driver 20.

Figure 14:
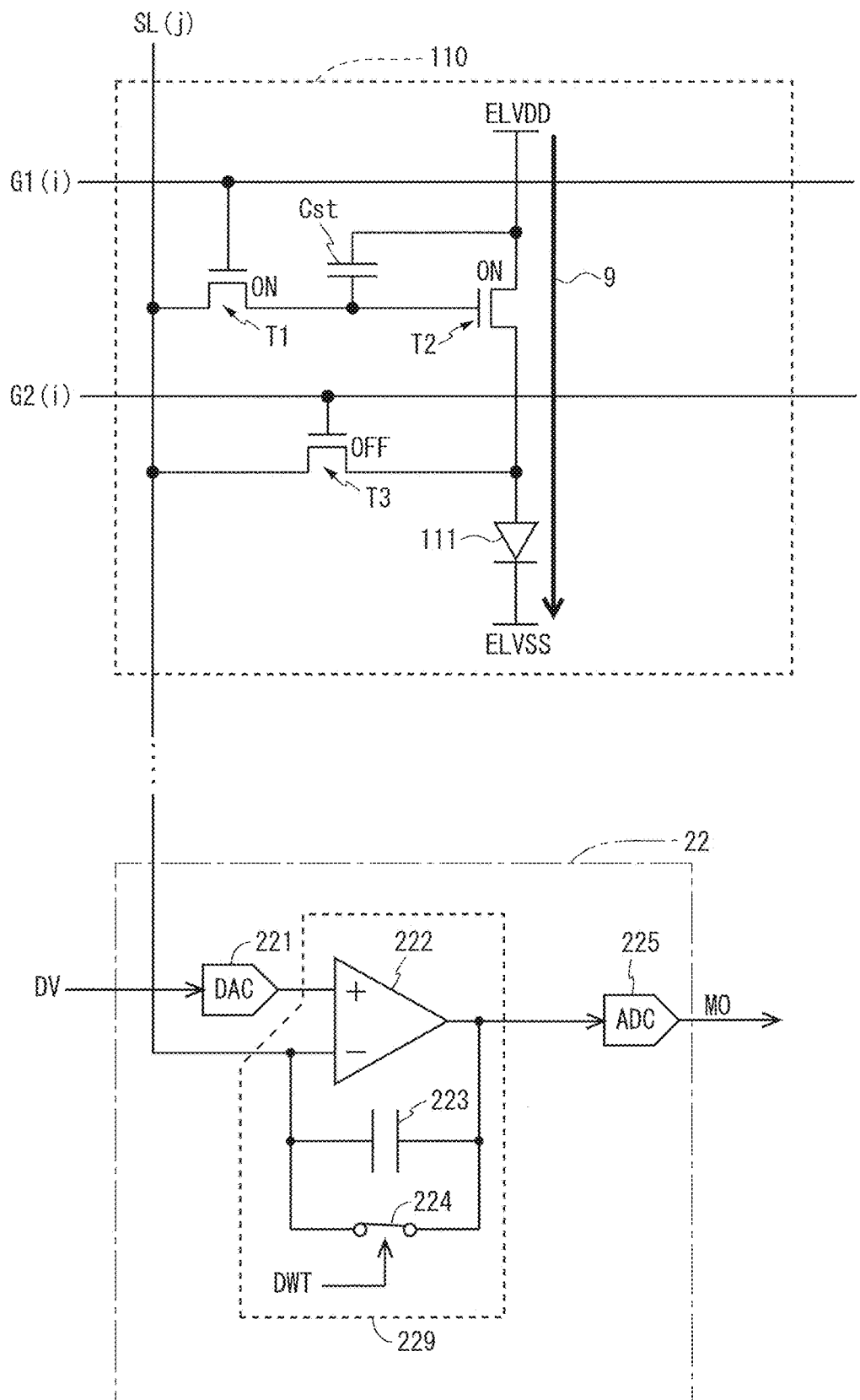
FIG. 14 is a diagram for describing the flow of a current during a video signal voltage writing period in the first embodiment.

During the video signal voltage writing period Tc, the scanning signal line G1(i) is brought into an active state and the monitoring control line G2(i) is brought into a non-active state. By this, the input transistor T1 is in an on state and the monitoring control transistor T3 is in an off state. In addition, during the video signal voltage writing period Tc, a voltage (video signal voltage) based on target luminance is applied to the data signal line SL(j). By this, the drive transistor T2 goes into an on state. As a result, as indicated by an arrow given reference character 9 in FIG. 14, a drive current is supplied to the organic EL element 111 through the drive transistor T2. By this, the organic EL element 111 emits light at luminance determined based on the drive current.

As described above, the characteristic detection process is performed row-by-row. Monitoring data MO obtained row-by-row is stored in, for example, a memory in the display control circuit 301. When pieces of monitoring data MO for all lines are obtained in this manner, the pieces of monitoring data MO are used in a compensation computation process for image data DAT.

<1.5 Control of Performance of the Characteristic Detection Process>

Figure 15:
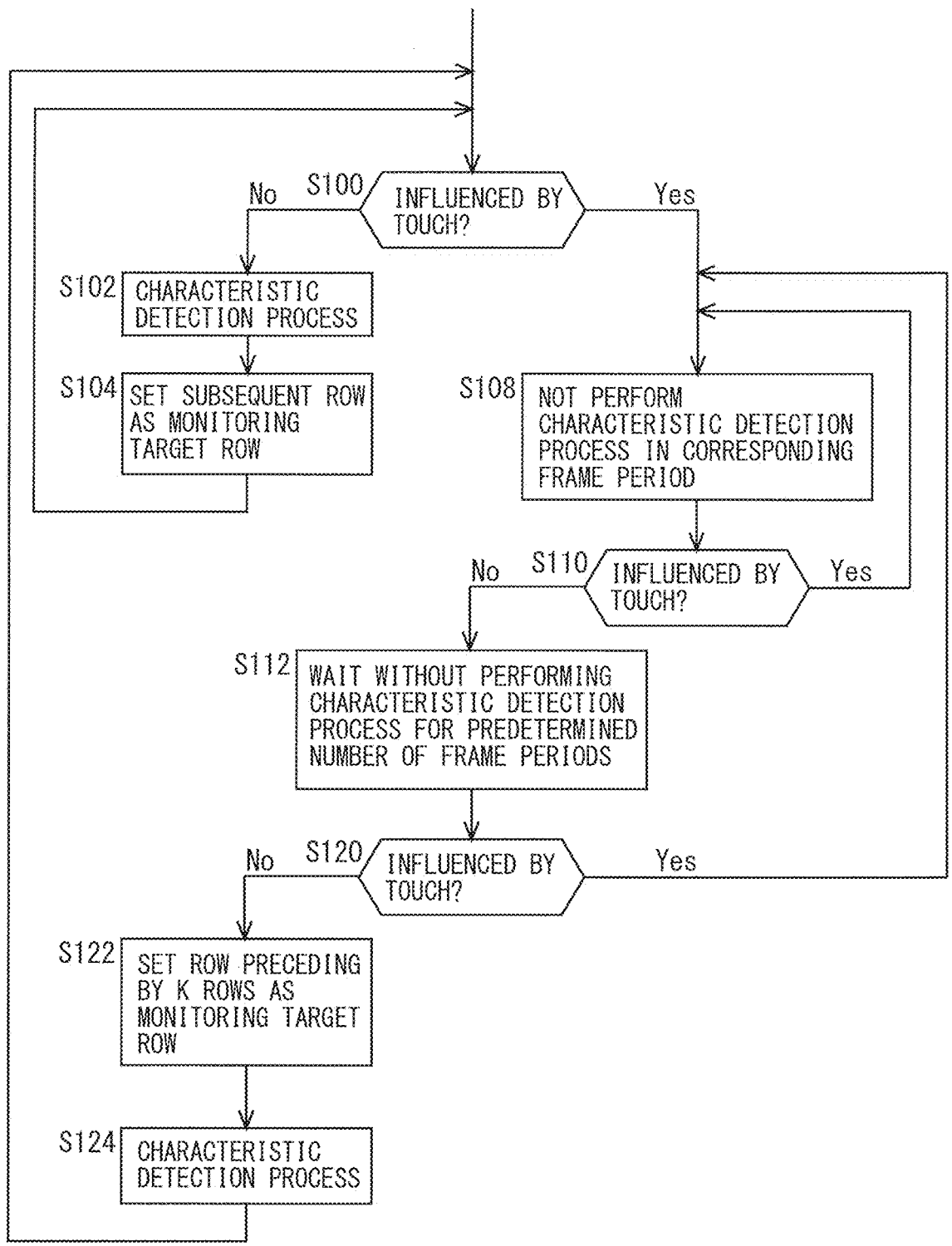
FIG. 15 is a flowchart for describing control of performance of the characteristic detection process in the first embodiment.

As described above, the organic EL display device according to the present embodiment controls performance of the characteristic detection process based on touch conditions, which will be described in detail with reference to a flowchart shown in FIG. 15. In FIG. 15, processes that are not essential (e.g., a process of setting an initial value for a monitoring target row and a process of determining whether or not the monitoring target row has reached the last row of the pixel matrix) are omitted. Note that, in this specification, the characteristic detection process that is performed such that monitoring data MO used in the compensation computation process is sequentially obtained row-by-row of the pixel matrix is referred to as a "characteristic detection process of usual". Meanwhile, there is also a case in which in order to improve the accuracy of characteristic detection, a characteristic of the same row is obtained in a predetermined number of frames and an average value of obtained data is used as monitoring data MO. The characteristic detection process for a case of thus performing a process of averaging data obtained in a plurality of frames is also included in the "characteristic detection process of usual". Thus, the characteristic detection process that is repeatedly performed for the same row as will be described later without performing a process of averaging is not the "characteristic detection process of usual".

In the present embodiment, the determination circuit 303 determines, every frame period, whether or not the characteristic detection process is influenced by touch (more specifically, when the characteristic detection process is performed in a corresponding frame period, whether or not current values obtained by performing the characteristic detection process are influenced by touch), based on a touch position and a monitoring target row (step S100, step S110, and step S120).

If the characteristic detection process has been performed as usual in a frame period immediately preceding a certain frame period, then a determination as to whether or not the characteristic detection process is influenced by touch is made at the start time of the certain frame period (step S100). If it is determined as a result of the determination that the characteristic detection process is influenced by touch, then processing proceeds to step S108, and if it is determined as a result of the determination that the characteristic detection process is not influenced by touch, then processing proceeds to step S102.

In step S102, the characteristic detection process is performed as usual for a monitoring target row. In other words, the display control circuit 301 controls the operation of the gate driver 12 and the source drivers 20 such that the characteristic detection process of usual is performed for the monitoring target row. Thereafter, in step S104, a row subsequent to the currently set row is set as a monitoring target row. Then, processing returns to step S100.

In step S108, the display control circuit 301 controls the operation of the gate driver 12 and the source drivers 20 such that the characteristic detection process is not performed in the target frame period. Thereafter, at the start time of a subsequent frame period, it is determined whether or not the characteristic detection process is influenced by touch (step S110). If it is determined as a result of the determination that the characteristic detection process is influenced by touch, then the display control circuit 301 controls the operation of the gate driver 12 and the source drivers 20 such that the characteristic detection process is not performed in this frame period, either (step S108). Since such control is performed, when it is determined in step S100 that the characteristic detection process is influenced by touch, the characteristic detection process of usual is stopped until it is determined in step S110 that the characteristic detection process is not influenced by touch.

If it is determined in step S110 that the characteristic detection process is not influenced by touch, then the display control circuit 301 controls the operation of the gate driver 12 and the source drivers 20 such that the characteristic detection process is still not performed for a predetermined number of frame periods (step S112). After a lapse of the predetermined number of frame periods, it is determined whether or not the characteristic detection process is influenced by touch (step S120). If it is determined as a result of the determination that the characteristic detection process is influenced by touch, then processing returns to step S108.

If it is determined in step S120 that the characteristic detection process is not influenced by touch, then a row located more on a first-row side by K rows (e.g., 10 rows) than the currently set row is set as a monitoring target row (step S122). Then, the characteristic detection process is performed as usual for the monitoring target row (step S124). In other words, the display control circuit 301 controls the operation of the gate driver 12 and the source drivers 20 such that the characteristic detection process of usual is performed for the monitoring target row. Thereafter, processing returns to step S100.

Note that, although a determination as to whether or not the characteristic detection process is influenced by touch is made every frame period in the present embodiment as described above, the configuration is not limited thereto, and the determination may be made with frequency different than "every frame period". The same also applies to second to fourth embodiments which will be described later.

Next, specifically, how it is determined whether or not the characteristic detection process is influenced by touch will be described. Meanwhile, the size of a unit of obtaining a sensor value SV by the sensor value obtaining circuit 312 does not match the size of a pixel circuit 110. One row for touch detection corresponds, for example, to 36 rows of the pixel matrix. In addition, the width (the width in a direction in which the data signal lines SL extend) of a finger at a portion where touch is performed corresponds, for example, to two rows for touch detection. Hence, in the following description, a region that is associated with a touch position identified by the touch position identification circuit 302 and that corresponds to a plurality of rows (e.g., 36 rows) of the pixel matrix is referred to as "touch occurrence zone". In addition, a determination as to whether or not the characteristic detection process is influenced by touch needs to be made, taking into account a temperature increase in not only a touched portion but also an area around the touched portion. Hence, in the following description, a region that includes a monitoring target row and corresponds to a plurality of rows of the pixel matrix is referred to as "monitoring neighboring zone".

In the present embodiment, the touch occurrence zone is compared with the monitoring neighboring zone, and if there is a region in which the touch occurrence zone overlaps the monitoring neighboring zone, then it is determined that the characteristic detection process is influenced by touch, and if there is not a region in which the touch occurrence zone overlaps the monitoring neighboring zone, then it is determined that the characteristic detection process is not influenced by touch. More specifically, with La and Lb being natural numbers, the determination circuit 303 compares a touch occurrence zone which is a region that is associated with a touch position identified by the touch position identification circuit 302 and that corresponds to La rows (e.g., 36 rows) of the pixel matrix with a monitoring neighboring zone which is a region that includes a monitoring target row and corresponds to Lb rows (e.g., 41 rows) of the pixel matrix. If there is a region in which the touch occurrence zone overlaps the monitoring neighboring zone, then the determination circuit 303 determines that the characteristic detection process is influenced by touch. If there is not a region in which the touch occurrence zone overlaps the monitoring neighboring zone, then the determination circuit 303 determines that the characteristic detection process is not influenced by touch.

Meanwhile, with Pa and Pb being natural numbers, the above-described Lb rows corresponding to the monitoring neighboring zone include the monitoring target row; Pa rows present more on a first-row side than the monitoring target row; and Pb rows present more on a last-row side than the monitoring target row. In the present embodiment, the value of Pa and the value of Pb can be freely set. For example, Lb=41, Pa=22, and Pb=18. In this example, 41 rows corresponding to the monitoring neighboring zone include the monitoring target row (one row); 22 rows present more on the first-row side than the monitoring target row; and 18 rows present more on the last-row side than the monitoring target row.

With reference to FIGS. 16 to 21, examples of a determination as to whether or not the characteristic detection process is influenced by touch (examples of a determination made by the determination circuit 303) will be described below. Note that a monitoring target row is given reference character 60.

Figure 16:
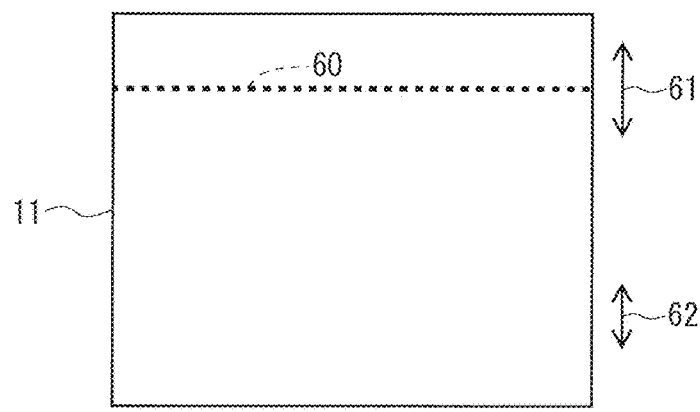
FIG. 16 is a diagram for describing an example of a determination as to whether or not the characteristic detection process is influenced by touch in the first embodiment.
Figure 17:
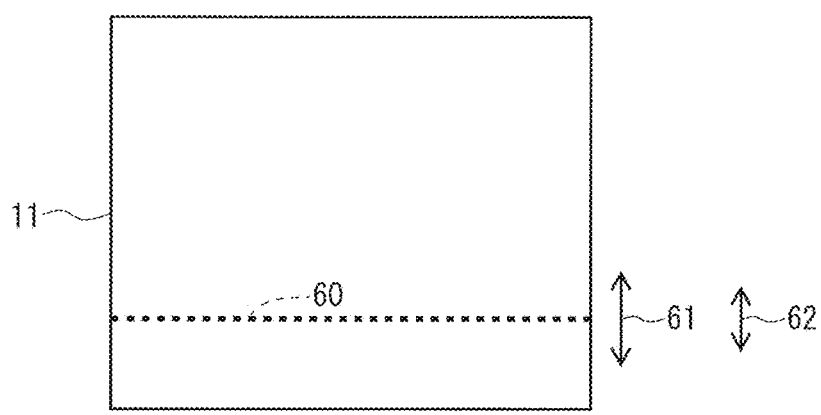
FIG. 17 is a diagram for describing an example of a determination as to whether or not the characteristic detection process is influenced by touch in the first embodiment.
Figure 18:
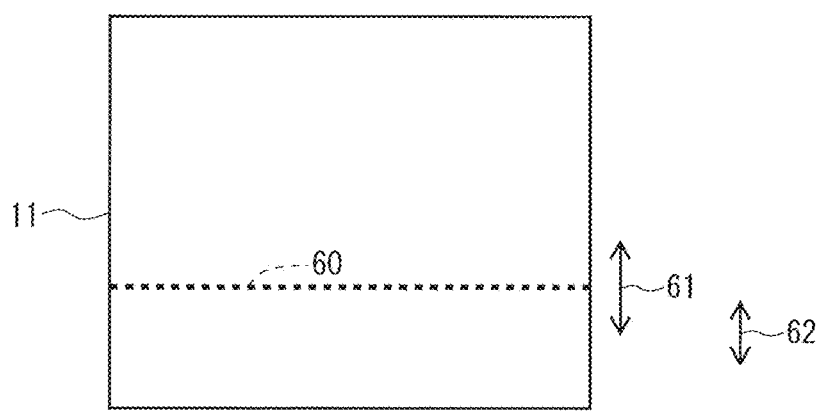
FIG. 18 is a diagram for describing an example of a determination as to whether or not the characteristic detection process is influenced by touch in the first embodiment.

First, with reference to FIGS. 16 to 18, a case in which touch is performed at only one location will be described. A monitoring neighboring zone (e.g., a region of 41 rows) is indicated by a double arrow given reference character 61, and a touch occurrence zone (e.g., a region of 36 rows) that occurs by performing touch on the display unit 11 is indicated by a double arrow given reference character 62. In an example shown in FIG. 16, the monitoring neighboring zone 61 and the touch occurrence zone 62 do not overlap each other at all. Thus, in this example, a determination result that the characteristic detection process is not influenced by touch is obtained. In an example shown in FIG. 17, the touch occurrence zone 62 is completely included in the monitoring neighboring zone 61. Thus, in this example, a determination result that the characteristic detection process is influenced by touch is obtained. In an example shown in FIG. 18, the monitoring neighboring zone 61 and the touch occurrence zone 62 partially overlap each other. In this example, a determination result that the characteristic detection process is influenced by touch is obtained.

Note that it is also possible to set the entire region of the display unit 11 as a monitoring neighboring zone 61. By performing such a setting, when there is touch, regardless of a touch position, a determination result that "the characteristic detection process is influenced by touch" can be obtained.

Figure 19:
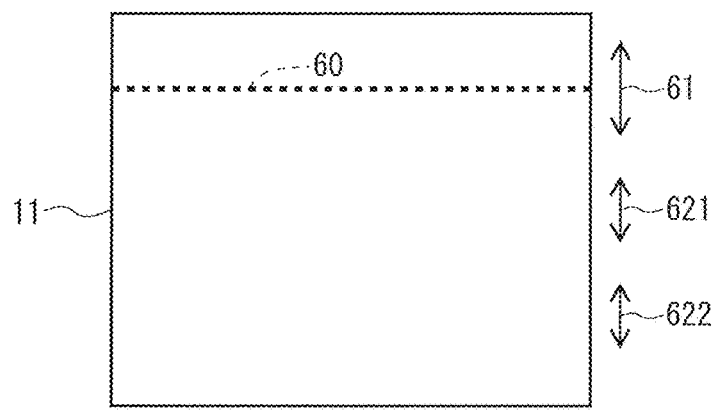
FIG. 19 is a diagram for describing an example of a determination as to whether or not the characteristic detection process is influenced by touch in the first embodiment.
Figure 20:
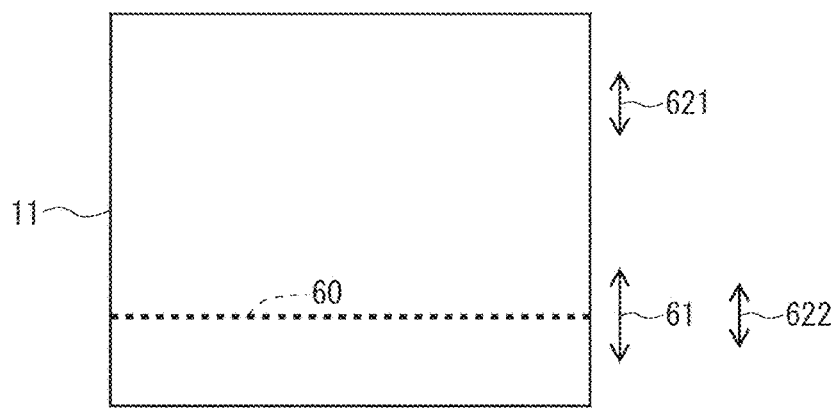
FIG. 20 is a diagram for describing an example of a determination as to whether or not the characteristic detection process is influenced by touch in the first embodiment.
Figure 21:
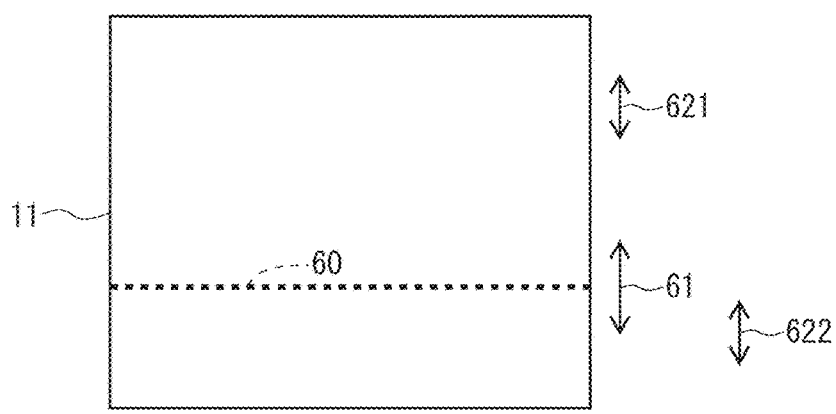
FIG. 21 is a diagram for describing an example of a determination as to whether or not the characteristic detection process is influenced by touch in the first embodiment.

Next, with reference to FIGS. 19 to 21, a case in which touch is performed at a plurality of locations will be described. Here, a case in which touch is performed at two locations is taken a look at. By performing touch at two locations, two touch occurrence zones 621 and 622 occur. In an example shown in FIG. 19, the monitoring neighboring zone 61 and the touch occurrence zone 621 do not overlap each other at all and the monitoring neighboring zone 61 and the touch occurrence zone 622 do not overlap each other at all. Thus, in this example, a determination result that the characteristic detection process is not influenced by touch is obtained. In an example shown in FIG. 20, the monitoring neighboring zone 61 and the touch occurrence zone 621 do not overlap each other at all, but the touch occurrence zone 622 is completely included in the monitoring neighboring zone 61. Thus, in this example, a determination result that the characteristic detection process is influenced by touch is obtained. In an example shown in FIG. 21, the monitoring neighboring zone 61 and the touch occurrence zone 621 do not overlap each other at all, but the monitoring neighboring zone 61 and the touch occurrence zone 622 partially overlap each other. In this example, a determination result that the characteristic detection process is influenced by touch is obtained.

Next, operation performed when it is determined that the characteristic detection process is influenced by touch will be described (note that it is assumed that the determination is made in step S100 of FIG. 15). In this case, the characteristic detection process is stopped until there is no more touch on the display unit 11 (step S108 and S110 of FIG. 15). Note that instead of this, the characteristic detection process may be repeatedly performed for a row that is set as a monitoring target row at that point in time until there is no more touch on the display unit 11. This is because data (monitoring data MO) obtained in a state in which the characteristic detection process is influenced by touch is overwritten with data that is obtained thereafter in a state in which the characteristic detection process is not influenced by touch, and thus, the data is not used in a compensation computation process.

Figure 22:
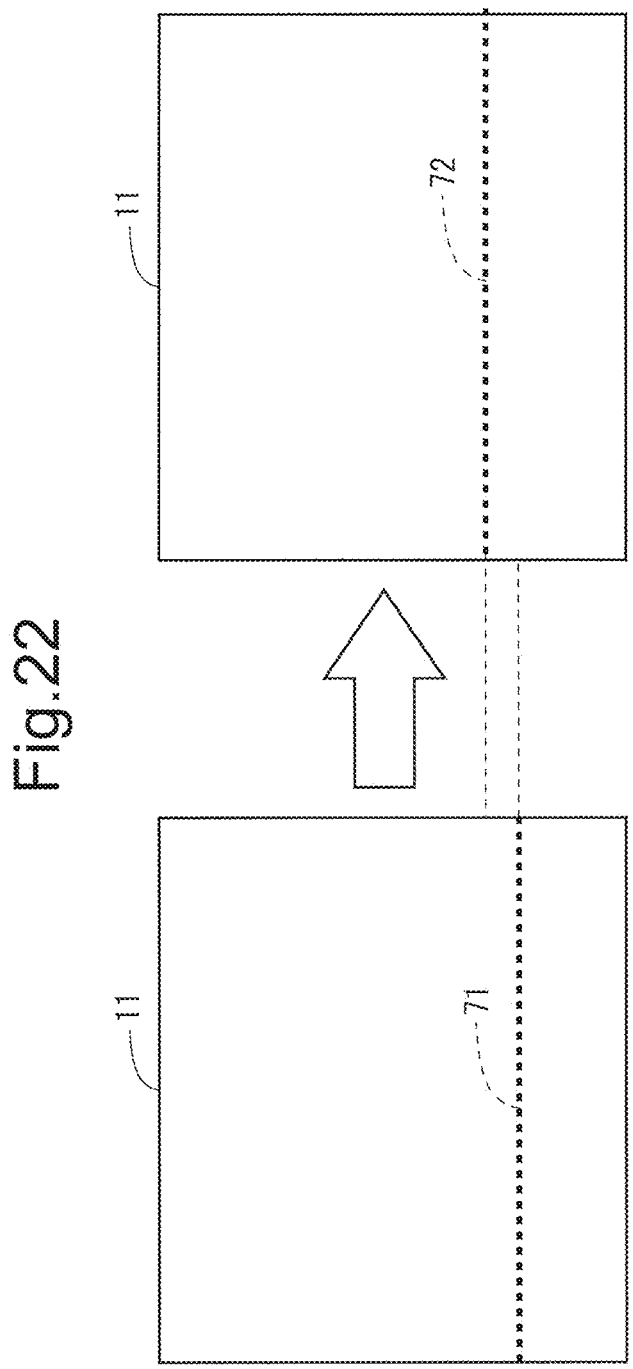
FIG. 22 is a diagram for describing operation performed when it is determined that the characteristic detection process is influenced by touch in the first embodiment.

After there is no more touch on the display unit 11, a state in which the characteristic detection process is stopped continues for a predetermined number of frame periods so that the temperature increased by touch is sufficiently reduced (step S112 of FIG. 15). Thereafter, if there is no touch on the display unit 11, then the characteristic detection process is resumed. Upon the resumption, for example, if the characteristic detection process is stopped when a row given reference character 71 in FIG. 22 is set as a monitoring target row, then the characteristic detection process is resumed in a state in which a row (a row given reference character 72 in FIG. 22) located more on a first-row side by specified rows than the row given reference character 71 is set as a monitoring target row. A reason that the monitoring target row is thus brought back to a row located on the first-row side is that since there is a time lag from when the touch controller 31 obtains a sensor value SV until a determination result RE obtained by performing a process by the determination circuit 303 in the timing controller 30 is obtained, the compensation computation process is not appropriately performed unless monitoring data MO for several rows is re-obtained.

As above, when the determination circuit 303 determines that the characteristic detection process is influenced by touch, the characteristic detection process of usual is resumed in a state in which a row located more on the first-row side by K rows than a currently set row is set as a monitoring target row, with K being a natural number. Here, the value of K can be freely set.

<1.6 Effects>

According to the present embodiment, the timing controller 30 is provided with the touch position identification circuit 302 that identifies a touch position on the display unit 11 based on data on sensor values SV transmitted from the touch controller 31; and the determination circuit 303 that determines whether or not the characteristic detection process is influenced by touch, based on the touch position and a monitoring target row, in addition to the display control circuit 301. When the determination circuit 303 determines that the characteristic detection process is influenced by touch, the characteristic detection process of usual is stopped until the next time the determination circuit 303 determines that the characteristic detection process is not influenced by touch. That is, only when it is determined by the determination circuit 303 that the characteristic detection process is not influenced by touch, the characteristic detection process of usual is performed. Therefore, the compensation computation process is not performed using monitoring data MO that is influenced by a temperature increase caused by touch. Thus, degradation of the drive transistors T2 or the organic EL elements 111 is appropriately compensated for. As above, according to the present embodiment, the organic EL display device equipped with the touch panel 4 suppresses degradation in display quality caused by touch.

<1.7 Variant>

In the above-described first embodiment, data on sensor values SV obtained by the sensor value obtaining circuit 312 is transmitted from the touch controller 31 to the timing controller 30, and touch position information TP required to control performance of the characteristic detection process is obtained by the touch position identification circuit 302 in the timing controller 30. However, the configuration is not limited thereto, and a configuration can also be adopted in which information on a touch position obtained by the touch controller 31 is transmitted from the touch controller 31 to the timing controller 30. This configuration will be described as a variant of the first embodiment.

Figure 23:
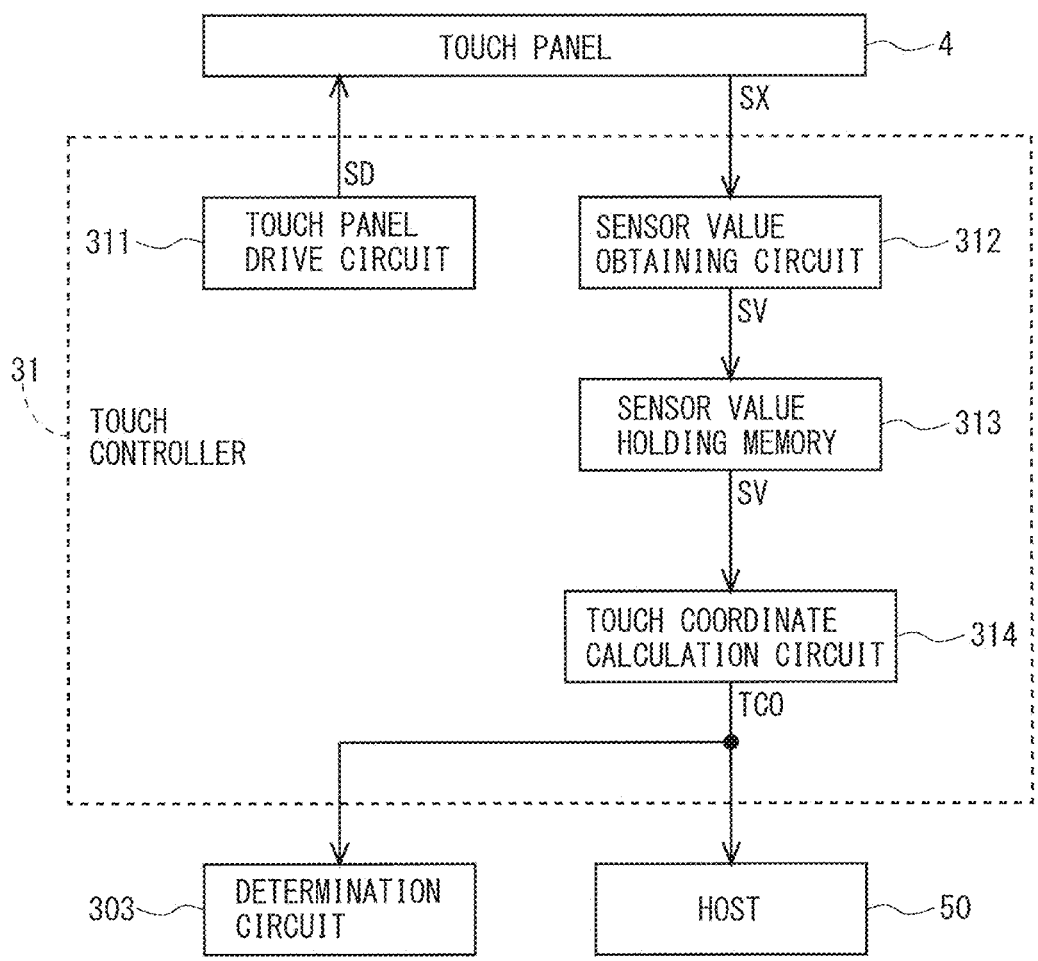
FIG. 23 is a block diagram showing a configuration for touch detection in a variant of the first embodiment.

FIG. 23 is a block diagram showing a configuration for touch detection in the present variant. In the present variant, unlike the first embodiment, data on sensor values SV is not transmitted from the touch controller 31 to the timing controller 30, but touch coordinate data TCO representing a touch position that is identified by the touch coordinate calculation circuit 314 is transmitted from the touch controller 31 into the timing controller 30, and is provided to the determination circuit 303. In order to realize this, there is provided a wiring line for transmitting the touch coordinate data TCO from the touch controller 31 to the timing controller 30. As an interface between the touch controller 31 and the timing controller 30, for example, an SPI interface or an I2C interface is adopted. Note that data transmitted from the touch controller 31 to the timing controller 30 may be data representing the above-described touch occurrence zone (i.e., data that identifies touched lines).

Figure 24:
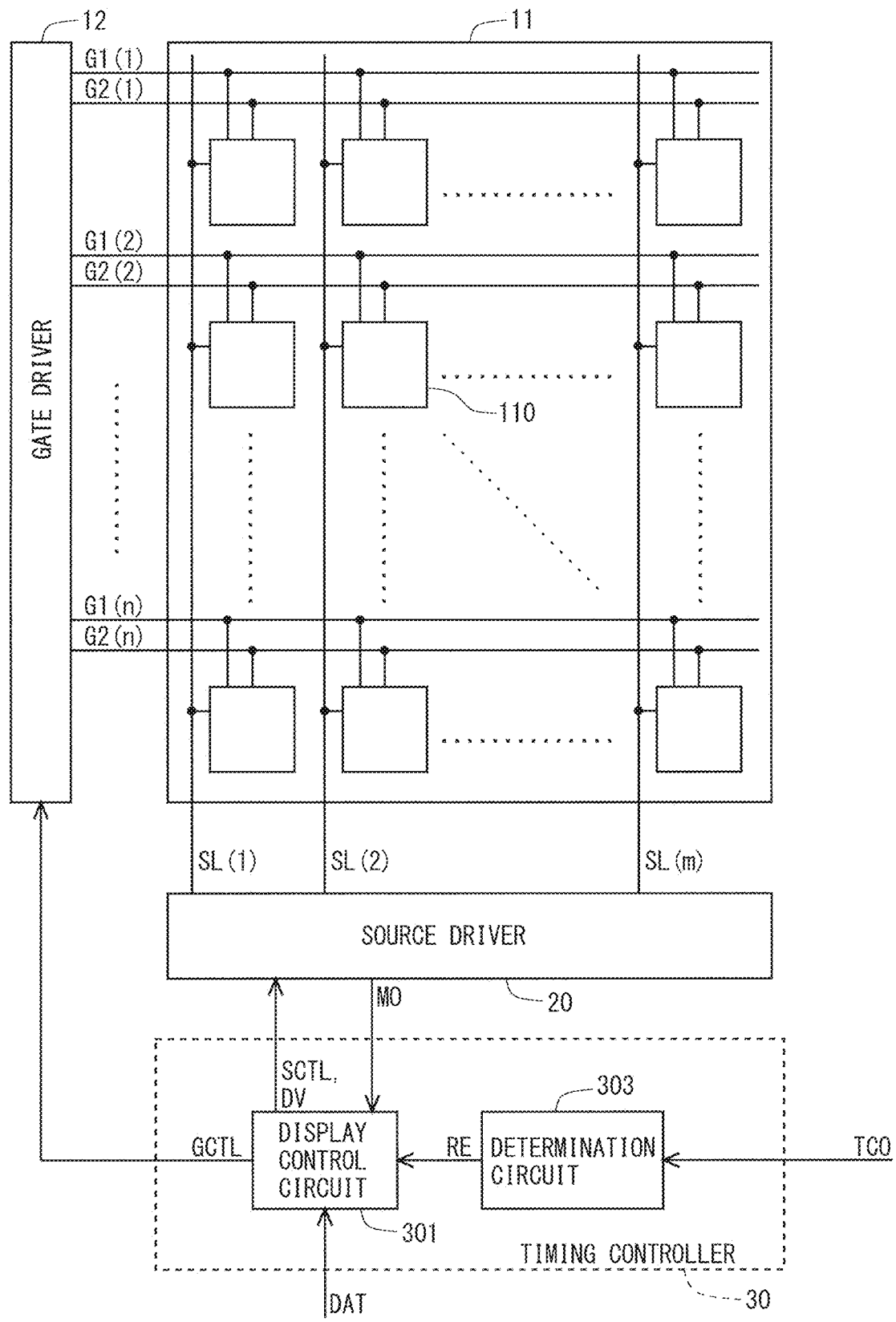
FIG. 24 is a block diagram showing a configuration for image display in the variant of the first embodiment.

FIG. 24 is a block diagram showing a configuration for image display in the present variant. In the present variant, unlike the first embodiment, the touch position identification circuit 302 is not provided in the timing controller 30 (the touch coordinate calculation circuit 314 in the touch controller 31 functions as the touch position identification circuit in the first embodiment). The determination circuit 303 determines whether or not the characteristic detection process is influenced by touch, based on a touch position represented by touch coordinate data TCO transmitted from the touch controller 31 and a monitoring target row.

Note that the flow of a process of controlling performance of the characteristic detection process and a procedure for a determination made by the determination circuit 303 (a procedure for a determination in step S100, step S110, and step S120 of FIG. 15) are the same as those of the first embodiment.

2. Second Embodiment

A second embodiment will be described. Mainly, differences from the first embodiment will be described below.

<2.1 Control of Performance of the Characteristic Detection Process>

In the above-described first embodiment, the monitoring neighboring zone is compared with the touch occurrence zone, and performance of the characteristic detection process is controlled based on a result of the comparison. On the other hand, in the present embodiment, a region that includes the aforementioned touch occurrence zone and corresponds to a plurality of rows of the pixel matrix is set as a "touch neighboring zone", and the touch neighboring zone is compared with the monitoring target row. If the monitoring target row is included in the touch neighboring zone, then it is determined that the characteristic detection process is influenced by touch, and if the monitoring target row is not included in the touch neighboring zone, then it is determined that the characteristic detection process is not influenced by touch. More specifically, with Ma and Mb being natural numbers and Ma<Mb, the determination circuit 303 compares the touch neighboring zone (a region corresponding to Mb rows of the pixel matrix) including the touch occurrence zone (a region corresponding to Ma rows of the pixel matrix) with the monitoring target row, and if the monitoring target row is included in the touch neighboring zone, then it is determined that the characteristic detection process is influenced by touch, and if the monitoring target row is not included in the touch neighboring zone, then it is determined that the characteristic detection process is not influenced by touch. Note that the touch occurrence zone is a region associated with a touch position identified by the touch position identification circuit 302.

Meanwhile, with Qa and Qb being natural numbers, the above-described Mb rows corresponding to the touch neighboring zone include the above-described Ma rows corresponding to the touch occurrence zone, Qa rows present more on a first-row side than the touch occurrence zone, and Qb rows present more on a last-row side than the touch occurrence zone. In the present embodiment, the value of Qa and the value of Qb can be freely set. For example, Ma=36, Mb=50, Qa=9, and Qb=5. In this example, 50 rows corresponding to the touch neighboring zone include 36 rows corresponding to the touch occurrence zone, 9 rows present more on the first-row side than the touch occurrence zone, and 5 rows present more on the last-row side than the touch occurrence zone.

With reference to FIGS. 25 to 30, examples of a determination as to whether or not the characteristic detection process is influenced by touch (examples of a determination made by the determination circuit 303) will be described below.

Figure 25:
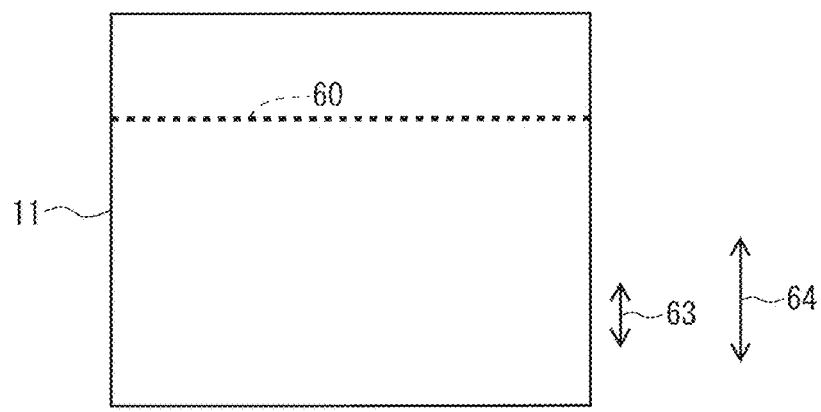
FIG. 25 is a diagram for describing an example of a determination as to whether or not the characteristic detection process is influenced by touch in a second embodiment.
Figure 26:
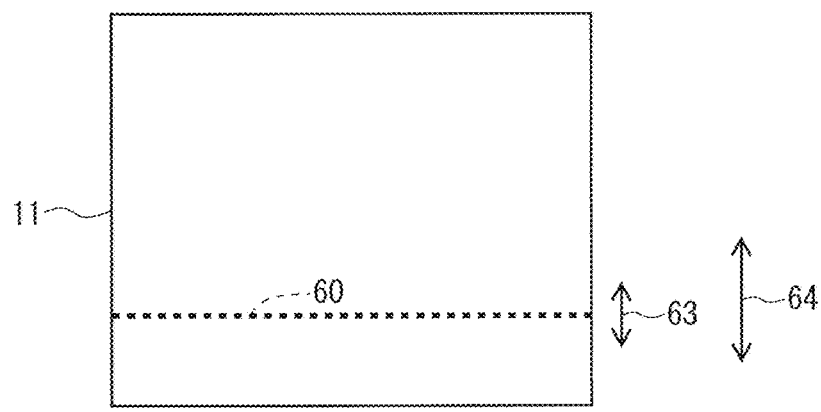
FIG. 26 is a diagram for describing an example of a determination as to whether or not the characteristic detection process is influenced by touch in the second embodiment.
Figure 27:
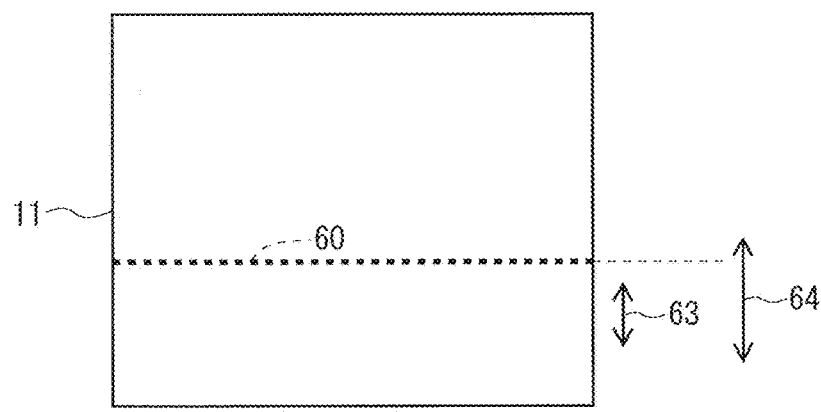
FIG. 27 is a diagram for describing an example of a determination as to whether or not the characteristic detection process is influenced by touch in the second embodiment.

First, with reference to FIGS. 25 to 27, a case in which touch is performed at only one location will be described. The touch occurrence zone is indicated by a double arrow given reference character 63, and the touch neighboring zone is indicated by a double arrow given reference character 64. In an example shown in FIG. 25, the monitoring target row 60 is not included in the touch neighboring zone 64. Thus, in this example, a determination result that the characteristic detection process is not influenced by touch is obtained. In an example shown in FIG. 26, the monitoring target row 60 is included in the touch occurrence zone 63 and the touch neighboring zone 64. Thus, in this example, a determination result that the characteristic detection process is influenced by touch is obtained. In FIG. 27, the monitoring target row 60 is not included in the touch occurrence zone 63, but is included in the touch neighboring zone 64. Thus, in this example, a determination result that the characteristic detection process is influenced by touch is obtained.

Figure 28:
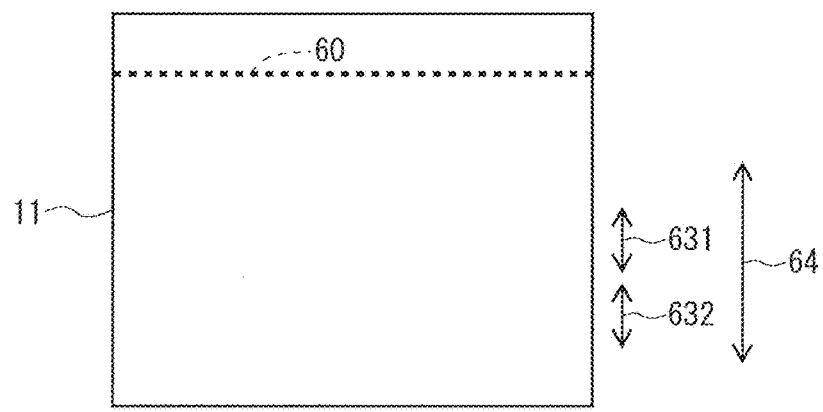
FIG. 28 is a diagram for describing an example of a determination as to whether or not the characteristic detection process is influenced by touch in the second embodiment.
Figure 29:
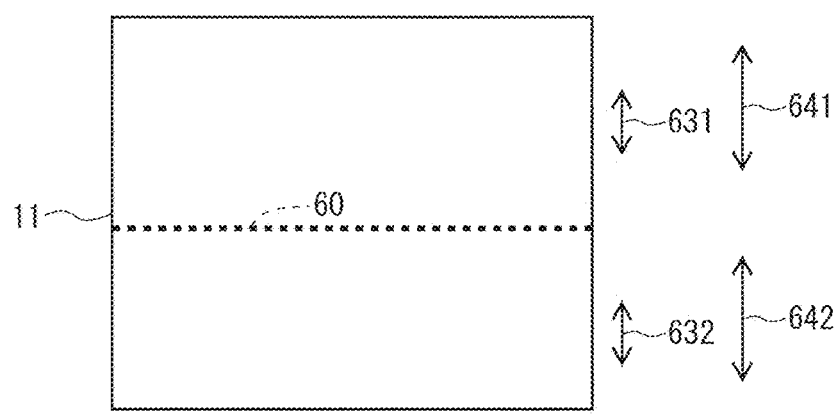
FIG. 29 is a diagram for describing an example of a determination as to whether or not the characteristic detection process is influenced by touch in the second embodiment.
Figure 30:
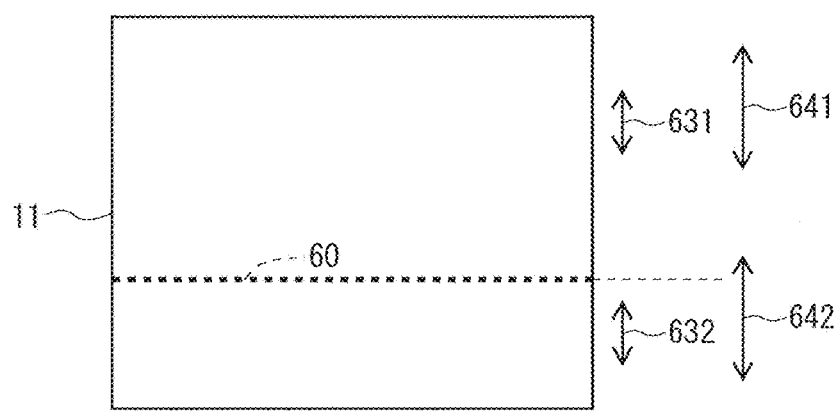
FIG. 30 is a diagram for describing an example of a determination as to whether or not the characteristic detection process is influenced by touch in the second embodiment.

Next, with reference to FIGS. 28 to 30, a case in which touch is performed at a plurality of locations will be described. Here, a case in which touch is performed at two locations is taken a look at. By performing touch at two locations, two touch occurrence zones 631 and 632 occur. In addition, depending on a positional relationship between the touch occurrence zone 631 and the touch occurrence zone 632, one touch neighboring zone 64 or two touch neighboring zones 641 and 642 occur. In an example shown in FIG. 28, the monitoring target row 60 is not included in the touch neighboring zone 64. Thus, in this example, a determination result that the characteristic detection process is not influenced by touch is obtained. In an example shown in FIG. 29, the monitoring target row 60 is not included in either the touch neighboring zone 641 or the touch neighboring zone 642. Thus, in this example, a determination result that the characteristic detection process is not influenced by touch is obtained. In an example shown in FIG. 30, the monitoring target row 60 is not included in the touch neighboring zone 641, but is included in the touch neighboring zone 642. Thus, in this example, a determination result that the characteristic detection process is influenced by touch is obtained. As above, when there are a plurality of touch positions identified by the touch position identification circuit 302, a plurality of touch neighboring zones are set so as to respectively correspond to the plurality of touch positions. If the monitoring target row is included in any one of the plurality of touch neighboring zones, then the determination circuit 303 determines that the characteristic detection process is influenced by touch.

Note that the flow of a process of controlling performance of the characteristic detection process is the same as that of the above-described first embodiment (see FIG. 15). That is, only a technique for a determination (a determination as to whether or not the characteristic detection process is influenced by touch) in step S100, step S110, and step S120 of FIG. 15 differs from that of the first embodiment, and others are the same as those of the first embodiment.

<2.2 Effects>

As in the above-described first embodiment, in the present embodiment, too, only when it is determined by the determination circuit 303 that the characteristic detection process is not influenced by touch, the normal characteristic detection process of usual is performed. Therefore, the compensation computation process is not performed using monitoring data MO that is influenced by a temperature increase caused by touch. By this, the organic EL display device equipped with the touch panel 4 suppresses degradation in display quality caused by touch.

3. Third Embodiment

<3.1 Overview and Configuration>

In the above-described first and second embodiments, control of performance of the characteristic detection process is performed based on immediately preceding touch conditions. However, normally, immediately after start of touch, current values obtained by performing the characteristic detection process are not influenced by touch. This is because since cover glass, etc., are present between a finger touching the display unit 11 and drive transistors T2 and organic EL elements 111 which are included in pixel circuits 110, it takes some time for the temperature to increase to a level that influences current values obtained in the characteristic detection process. As such, when touch on the display unit 11 is performed only for a short period of time, even if the characteristic detection process is performed for a row corresponding to a touch position, monitoring data MO that is not influenced by a temperature increase caused by touch is obtained.

Hence, in the present embodiment, there is provided a counter whose value increases when there is touch and whose value is set to 0 when there is no touch, for each frame period, and a determination as to whether or not the characteristic detection process is influenced by touch is made taking into account the value of the counter.

Figure 31:
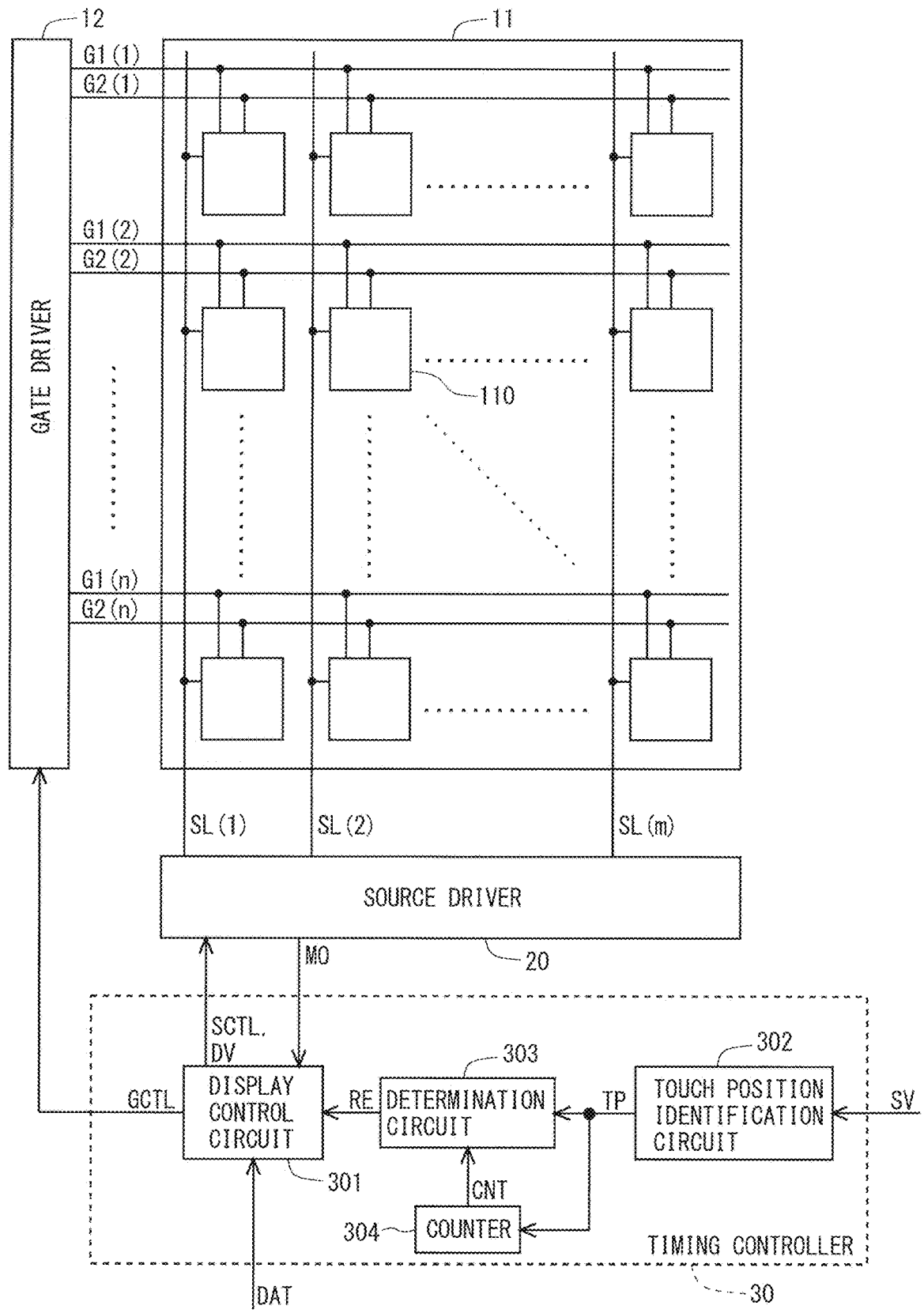
FIG. 31 is a block diagram showing a configuration for image display in a third embodiment.

FIG. 31 is a block diagram showing a configuration for image display in the present embodiment. As can be grasped from a comparison of FIGS. 1 and 31, the configuration of the timing controller 30 differs from that of the above-described first embodiment. The timing controller 30 in the present embodiment is provided with one counter 304 in addition to the display control circuit 301, the touch position identification circuit 302, and the determination circuit 303. As described above, the counter 304 increases a value CNT when touch position information TP indicates that there is touch, and sets the value CNT to 0 when the touch position information TP indicates that there is no touch, for each frame period. A determination (a determination as to whether or not the characteristic detection process is influenced by touch) by the determination circuit 303 is made by first comparing the value CNT of the counter 304 with a threshold value. If, as a result of the comparison, the value CNT of the counter 304 is smaller than the threshold value, then regardless of a positional relationship between a touch position and a monitoring target row, the determination circuit 303 determines that the characteristic detection process is not influenced by touch. If the value CNT of the counter 304 is greater than or equal to the threshold value, then as in the above-described first embodiment or second embodiment, the determination circuit 303 determines whether or not the characteristic detection process is influenced by touch.

Meanwhile, although the value CNT of the counter 304 is set to 0 when there is no touch in the present embodiment, the configuration is not limited thereto. The value CNT of the counter 304 may decrease when there is no touch, with a lower limit value being 0.

<3.2 Control of Performance of the Characteristic Detection Process>

The overall flow of a process of controlling performance of the characteristic detection process is the same as that of the above-described first embodiment (see FIG. 15). However, a procedure for a determination (a determination as to whether or not the characteristic detection process is influenced by touch) in step S100, step S110, and step S120 of FIG. 15 differs from that of the first embodiment. The procedure for the determination will be described below. Note that the determination is made every frame period as in the first embodiment.

First, the value CNT of the counter 304 is compared with the threshold value. If, as a result of the comparison, the value CNT of the counter 304 is smaller than the threshold value, then it is determined that the characteristic detection process is not influenced by touch. On the other hand, if the value CNT of the counter 304 is greater than or equal to the threshold value, then as in the above-described first embodiment, the touch occurrence zone is compared with the monitoring neighboring zone. If, as a result of the comparison, there is a region in which the touch occurrence zone overlaps the monitoring neighboring zone, then it is determined that the characteristic detection process is influenced by touch, and if there is not a region in which the touch occurrence zone overlaps the monitoring neighboring zone, then it is determined that the characteristic detection process is not influenced by touch. Note that when the value CNT of the counter 304 is greater than or equal to the threshold value, as in the above-described second embodiment, a determination may be made based on a result of a comparison of the touch neighboring zone with the monitoring target row.

With reference to FIGS. 32 to 35, examples of a determination as to whether or not the characteristic detection process is influenced by touch (examples of a determination made by the determination circuit 303) will be described below. Note that it is assumed that the threshold value is set to "10". Note also that, in FIGS. 32 to 35, the value CNT of the counter 304 obtained at the time of a determination is shown in a rectangle given reference character 73.

Figure 32:
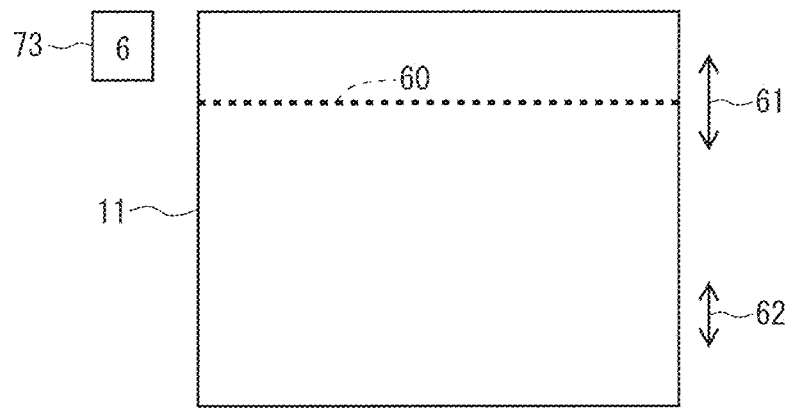
FIG. 32 is a diagram for describing an example of a determination as to whether or not the characteristic detection process is influenced by touch in the third embodiment.
Figure 33:
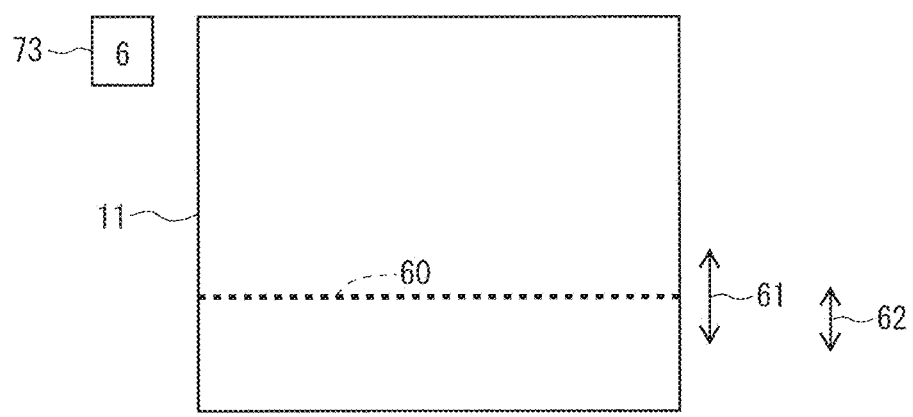
FIG. 33 is a diagram for describing an example of a determination as to whether or not the characteristic detection process is influenced by touch in the third embodiment.

In an example shown in FIG. 32, the value CNT of the counter 304 is "6". That is, the value CNT of the counter 304 is smaller than the threshold value. Thus, in this example, a determination result that the characteristic detection process is not influenced by touch is obtained. In an example shown in FIG. 33, the monitoring neighboring zone 61 and the touch occurrence zone 62 overlap each other. However, the value CNT of the counter 304 is "6". That is, the value CNT of the counter 304 is smaller than the threshold value. Thus, in this example, a determination result that the characteristic detection process is not influenced by touch is obtained. In an example shown in FIG. 34, the value CNT of the counter 304 is "12". That is, the value CNT of the counter 304 is greater than or equal to the threshold value. However, the monitoring neighboring zone 61 and the touch occurrence zone 62 do not overlap each other at all. Thus, in this example, a determination result that the characteristic detection process is not influenced by touch is obtained. In an example shown in FIG. 35, the value CNT of the counter 304 is "12". That is, the value CNT of the counter 304 is greater than or equal to the threshold value. Moreover, the monitoring neighboring zone 61 and the touch occurrence zone 62 overlap each other. Thus, in this example, a determination result that the characteristic detection process is influenced by touch is obtained.

<3.3 Effects>

According to the present embodiment, the counter 304 whose value increases when there is touch and whose value is set to 0 when there is no touch, for each frame period, is provided, and if the value CNT of the counter 304 is smaller than the threshold value, then regardless of a positional relationship between a touch position and a monitoring target row, it is determined that the characteristic detection process is not influenced by touch. By this, compared to the above-described first embodiment and second embodiment, it becomes possible to reduce the number of times the characteristic detection process is stopped. Thus, according to the present embodiment, it becomes possible to suppress degradation in display quality caused by touch while suppressing a reduction in the efficiency of obtaining monitoring data MO.

<3.4 Variants>

Variants of the above-described third embodiment will be described below.

<3.4.1 First variant>

In the third embodiment, the counter 304 is provided in the timing controller 30. However, the configuration is not limited thereto, and a configuration in which a counter is provided in the touch controller 31 can also be adopted. This configuration is described as a first variant of the third embodiment.

Figure 36:
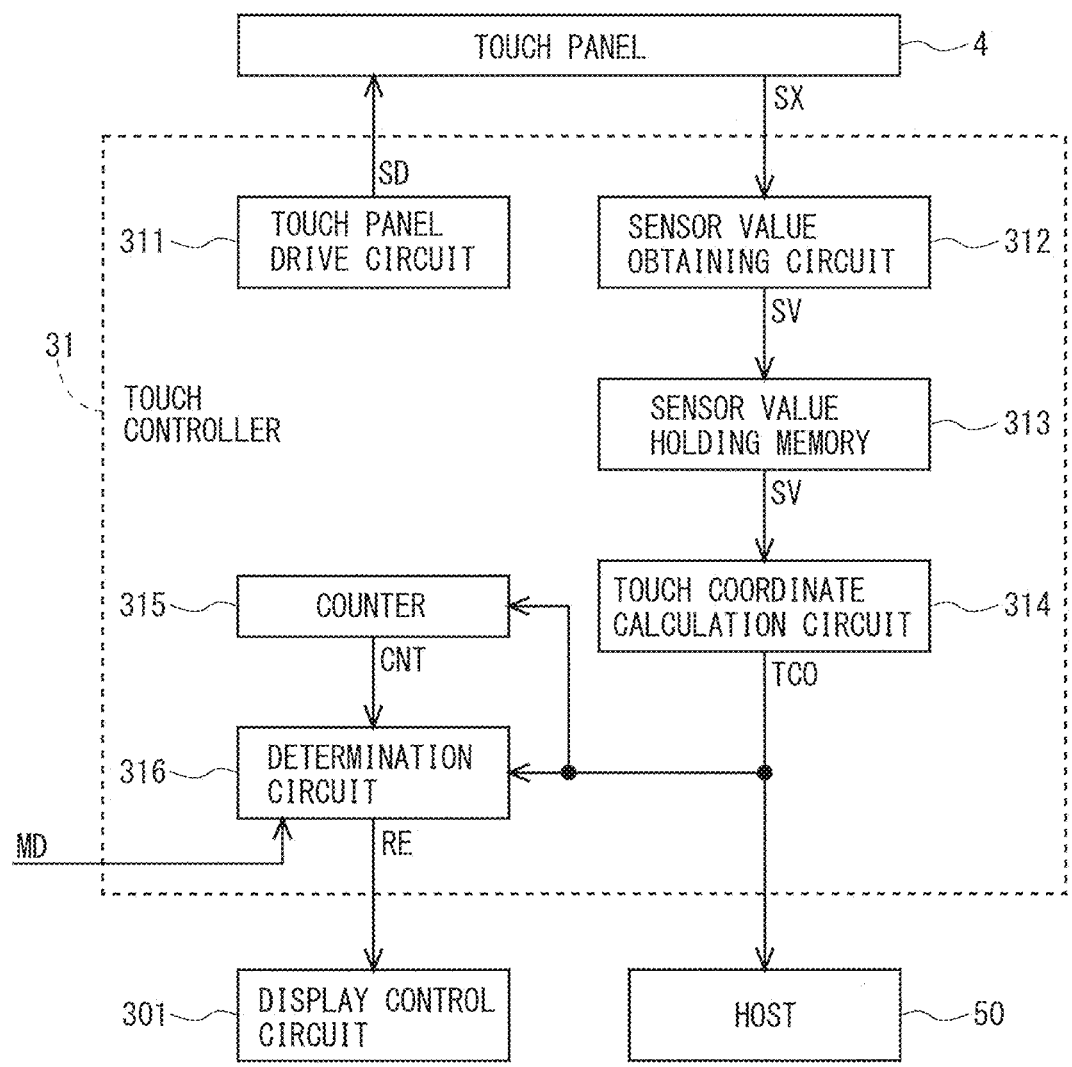
FIG. 36 is a block diagram showing a configuration for touch detection in a first variant of the third embodiment.

FIG. 36 is a block diagram showing a configuration for touch detection in the present variant. As shown in FIG. 36, the touch controller 31 in the present variant includes the touch panel drive circuit 311, the sensor value obtaining circuit 312, the sensor value holding memory 313, the touch coordinate calculation circuit 314, a counter 315, and a determination circuit 316. The operation of the touch panel drive circuit 311, the sensor value obtaining circuit 312, the sensor value holding memory 313, and the touch coordinate calculation circuit 314 is the same as that of the above-described first embodiment.

Touch coordinate data TCO outputted from the touch coordinate calculation circuit 314 also includes information indicating whether or not there is touch at any position on the display unit 11, and the value CNT of the counter 315 changes based on the information. Specifically, as in the above-described third embodiment, for each frame period, the value CNT of the counter 315 increases when there is touch, and is set to 0 when there is no touch.

The determination circuit 316 determines whether or not the characteristic detection process is influenced by touch, based on a touch position indicated by the touch coordinate data TCO outputted from the touch coordinate calculation circuit 314 and a monitoring target row which is a row to be subjected to the characteristic detection process, taking into account the value CNT of the counter 315. In order to realize this, in the present variant, information MD indicating the monitoring target row is provided from the timing controller 30 to the determination circuit 316 in the touch controller 31.

Figure 37:
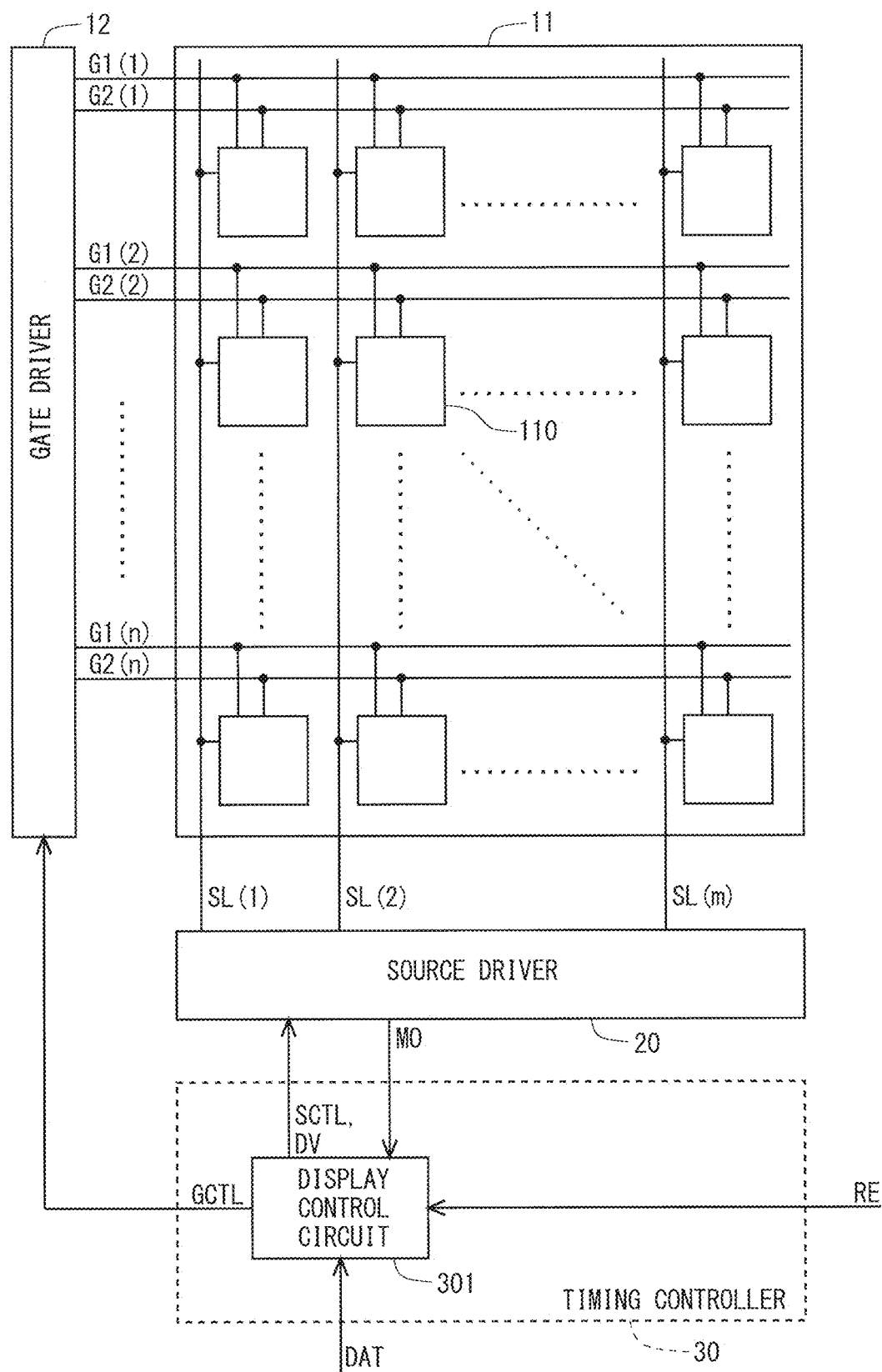
FIG. 37 is a block diagram showing a configuration for image display in the first variant of the third embodiment.

FIG. 37 is a block diagram showing a configuration for image display in the present variant. In the present variant, unlike the above-described third embodiment (see FIG. 31), the touch position identification circuit 302, the determination circuit 303, and the counter 304 are not provided in the timing controller 30. A determination result (a determination result as to whether or not the characteristic detection process is influenced by touch) RE is provided from the determination circuit 316 in the touch controller 31 to the display control circuit 301 in the timing controller 30. Based on the determination result RE, the display control circuit 301 controls performance of the characteristic detection process.

Note that the overall flow of a process of controlling performance of the characteristic detection process and a procedure for a determination made by the determination circuit 316 (a procedure for a determination in step S100, step S110, and step S120 of FIG. 15) are the same as those of the third embodiment.

<3.4.2 Second Variant>

In the above-described third embodiment, only one counter 304 is provided. According to that configuration, when a finger slides in a state in which the finger touches the display unit 11, the value of the counter 304 increases throughout a period during which the finger slides. Hence, when an area near a finger slide's destination is a monitoring target row, it may be determined that the characteristic detection process is influenced by touch, despite only a slight increase in the temperature of an area near the monitoring target row. Hence, in the present variant, the counter 304 is provided for each line corresponding to one row of touch coordinates being a unit of obtaining a sensor value SV by the sensor value obtaining circuit 312.

In the present variant, based on touch position information TP outputted from the touch position identification circuit 302, for each frame period, the value of each counter 304 provided for each line increases when there is touch on a corresponding line, and decreases, with a lower limit value being 0, when there is no touch on the corresponding line. Note, however, that the value of the counter 304 may be set to 0 when there is no touch on the corresponding line.

A determination (a determination as to whether or not the characteristic detection process is influenced by touch) by the determination circuit 303 is made as follows. The value of each of counters corresponding to the monitoring neighboring zone is compared with a threshold value. If, as a result of the comparison, the value of any one of the counters corresponding to the monitoring neighboring zone is greater than or equal to the threshold value, then it is determined that the characteristic detection process is influenced by touch. On the other hand, if the values of all counters corresponding to the monitoring neighboring zone are less than the threshold value, then it is determined that the characteristic detection process is not influenced by touch. Note that the overall flow of a process of controlling performance of the characteristic detection process is the same as that of the above-described first embodiment (see FIG. 15).

With reference to FIGS. 38 to 41, examples of a determination as to whether or not the characteristic detection process is influenced by touch (examples of a determination made by the determination circuit 303) will be described below. Note that it is assumed that the threshold value is set to "10". Note, also that, in FIGS. 38 to 41, the value of each counter 304 provided for each line is shown in a portion indicated by an arrow given reference character 74.

Figure 38:
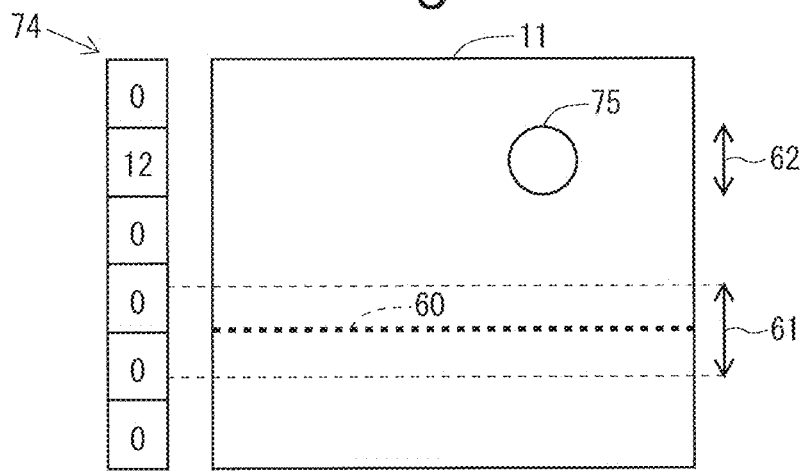
FIG. 38 is a diagram for describing an example of a determination as to whether or not the characteristic detection process is influenced by touch in a second variant of the third embodiment.
Figure 39:
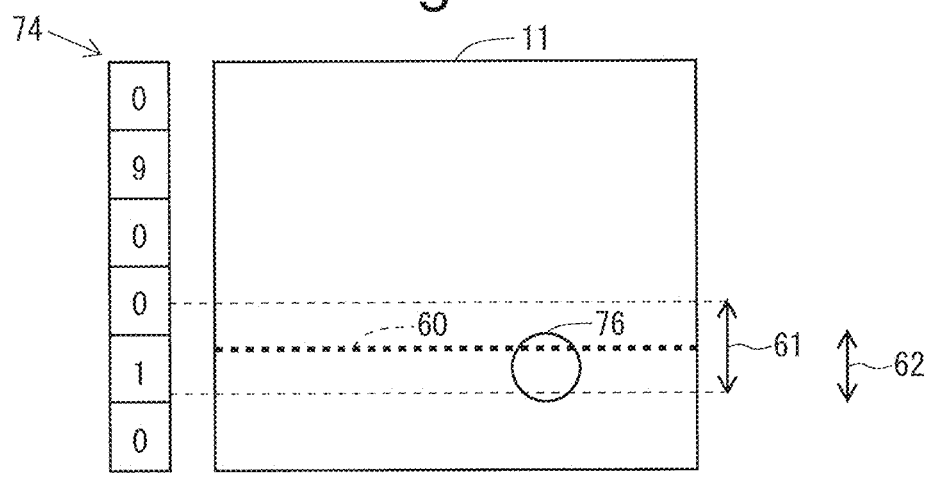
FIG. 39 is a diagram for describing an example of a determination as to whether or not the characteristic detection process is influenced by touch in the second variant of the third embodiment.

First, a case in which a finger slides from a portion given reference character 75 in FIG. 38 to a portion given reference character 76 in FIG. 39 in a state in which the finger touches the display unit 11 is taken a look at. Before starting a slide of the finger, as shown in FIG. 38, the value of the counter 304 corresponding to a touched portion (the portion given reference character 75) is "12". That is, the value of the counter 304 corresponding to the touched portion is greater than or equal to the threshold value. However, the values of counters 304 corresponding to the monitoring neighboring zone 61 are both "0". Thus, a determination result that the characteristic detection process is not influenced by touch is obtained. Thereafter, by sliding the finger over three frame periods, a state shown in FIG. 39 appears. At this time, the monitoring neighboring zone 61 overlaps the touch occurrence zone 62, but the values of the counters 304 corresponding to the monitoring neighboring zone 61 are "0" and "1". That is, the values of all counters 304 corresponding to the monitoring neighboring zone 61 are less than the threshold value. Thus, a determination result that the characteristic detection process is not influenced by touch is obtained.

Figure 40:
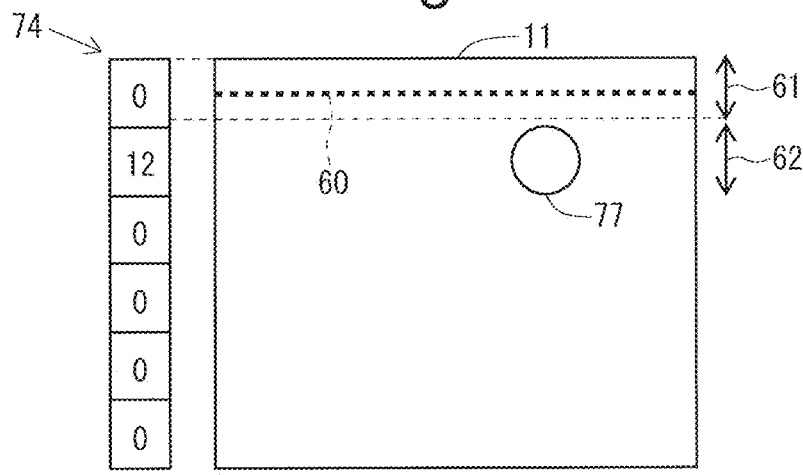
FIG. 40 is a diagram for describing an example of a determination as to whether or not the characteristic detection process is influenced by touch in the second variant of the third embodiment.
Figure 41:
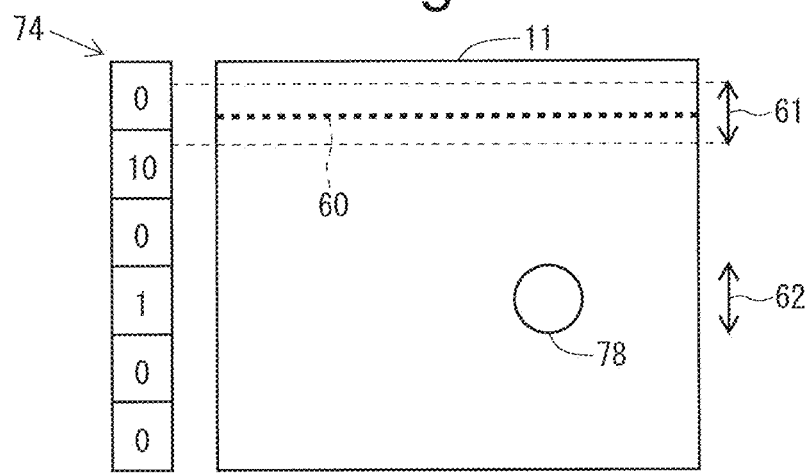
FIG. 41 is a diagram for describing an example of a determination as to whether or not the characteristic detection process is influenced by touch in the second variant of the third embodiment.

Next, a case in which a finger slides from a portion given reference character 77 in FIG. 40 to a portion given reference character 78 in FIG. 41 in a state in which the finger touches the display unit 11 is taken a look at. Before starting a slide of the finger, as shown in FIG. 40, the value of the counter 304 corresponding to a touched portion (the portion given reference character 77) is "12". That is, the value of the counter 304 corresponding to the touched portion is greater than or equal to the threshold value. However, the value of the counter 304 corresponding to the monitoring neighboring zone 61 is "0". That is, the value of the counter 304 corresponding to the monitoring neighboring zone 61 is less than the threshold value. Thus, a determination result that the characteristic detection process is not influenced by touch is obtained. Thereafter, by sliding the finger over two frame periods, a state shown in FIG. 41 appears (during the two frame periods, the monitoring target row moves to a last-row side). At this time, the monitoring neighboring zone 61 does not overlap the touch occurrence zone 62, but the values of the counters 304 corresponding to the monitoring neighboring zone 61 are "0" and "10". That is, the value of one of the counters 304 corresponding to the monitoring neighboring zone 61 is greater than or equal to the threshold value. Thus, a determination result that the characteristic detection process is influenced by touch is obtained.

As above, according to the present variant, if there is only a slight increase in the temperature of a finger slide's destination when a finger slides to an area near a monitoring target row, even if touch continues, the characteristic detection process is performed as usual. By this, it becomes possible to effectively reduce the number of times the characteristic detection process is stopped.

<3.4.3 Third Variant>

In the present variant, the counter 304 is provided for each touch coordinates being a unit of obtaining a sensor value SV by the sensor value obtaining circuit 312. The value of each counter 304 provided for each touch coordinates increases when there is touch on a corresponding portion on the display unit 11, and is set to 0 when there is no touch on the corresponding portion on the display unit 11, for each frame period. Note that the value of the counter 304 may decrease when there is no touch on the corresponding portion on the display unit 11, with a lower limit value being 0.

A determination (a determination as to whether or not the characteristic detection process is influenced by touch) by the determination circuit 303 is made as follows. The value of each of counters corresponding to the monitoring neighboring zone is compared with a threshold value. If, as a result of the comparison, the value of any one of the counters corresponding to the monitoring neighboring zone is greater than or equal to the threshold value, then it is determined that the characteristic detection process is influenced by touch. On the other hand, if the values of all counters corresponding to the monitoring neighboring zone are less than the threshold value, then it is determined that the characteristic detection process is not influenced by touch. Note that the overall flow of a process of controlling performance of the characteristic detection process is the same as that of the above-described first embodiment (see FIG. 15).

The counter 304 provided for each touch coordinates is schematically shown in, for example, FIG. 42. With reference to this FIG. 42, examples of a determination as to whether or not the characteristic detection process is influenced by touch (examples of a determination made by the determination circuit 303) will be described. Note that it is assumed that the threshold value is set to "10". When counters in a portion indicated by an arrow given reference character 81 are counters corresponding to the monitoring neighboring zone, the values of all counters corresponding to the monitoring neighboring zone are less than the threshold value. Thus, in this case, a determination result that the characteristic detection process is not influenced by touch is obtained. When counters in a portion indicated by an arrow given reference character 82 are counters corresponding to the monitoring neighboring zone, there is a counter whose value is greater than or equal to the threshold value (see the value of a portion given reference character 83). Thus, in this case, a determination result that the characteristic detection process is influenced by touch is obtained.

As in the above-described second variant, in the present variant, too, it becomes possible to effectively reduce the number of times the characteristic detection process is stopped.

4. Fourth Embodiment

<4.1 Configuration>

In the above-described first to third embodiments, a determination as to whether or not the characteristic detection process is influenced by touch is made based on a touch position and a monitoring target row, and performance of the characteristic detection process is controlled based on a determination result. On the other hand, in the present embodiment, performance of the characteristic detection process is controlled based on whether or not there is touch on the display unit 11, without taking into account a touch position. In order to realize this, in the present embodiment, as shown in FIG. 43, a touch determination signal ST indicating whether or not there is touch on the display unit 11 is transmitted from the touch controller 31 to the timing controller 30. For example, as shown in FIG. 44, the touch determination signal ST is maintained at high level when there is touch on the display unit 11, and is maintained at low level when there is no touch on the display unit 11. Note, however, that the configuration is not limited thereto. Note that a determination as to whether there is touch is made based on sensor values SV held in the sensor value holding memory 313 in the touch controller 31.

Figure 45:
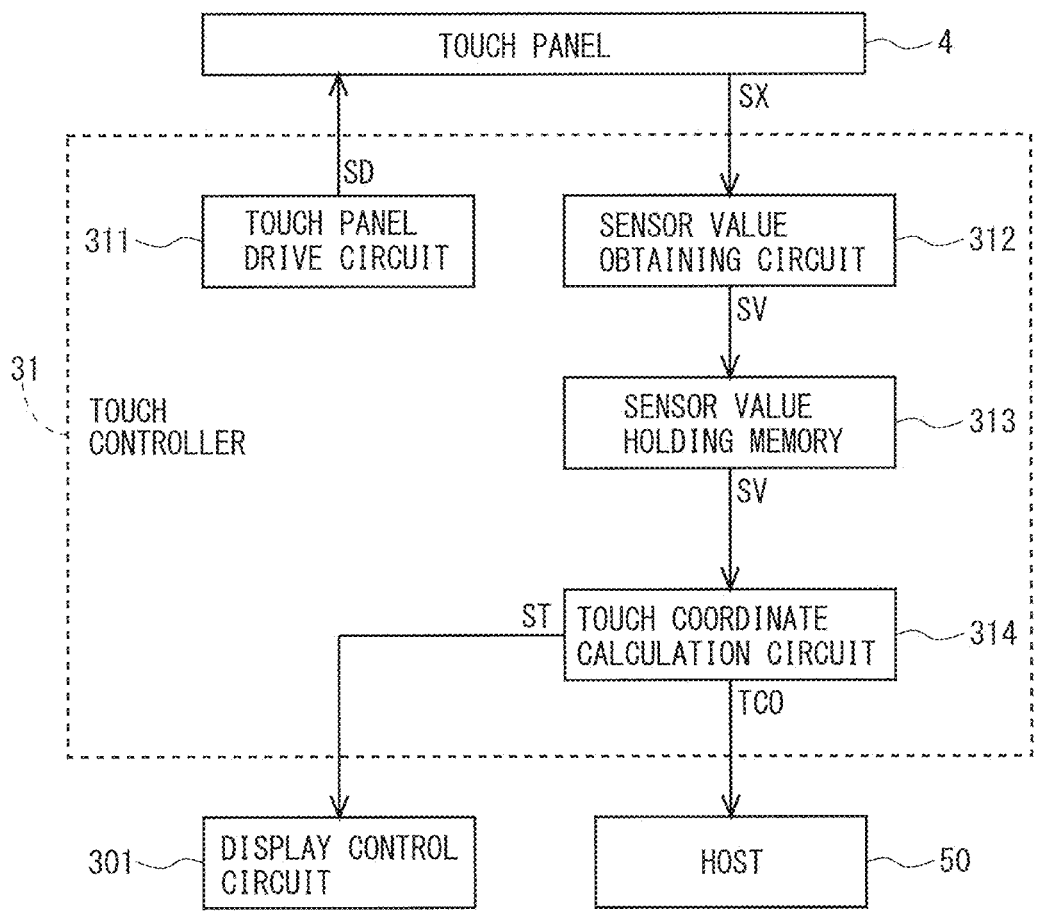
FIG. 45 is a block diagram showing a configuration for touch detection in the fourth embodiment.

FIG. 45 is a block diagram showing a configuration for touch detection in the present embodiment. In the present embodiment, the touch coordinate calculation circuit 314 identifies a touch position based on sensor values SV stored in the sensor value holding memory 313, and generates and outputs a touch determination signal ST indicating whether or not there is touch on the display unit 11. The touch determination signal ST generated by the touch coordinate calculation circuit 314 is transmitted to the display control circuit 301 in the timing controller 30. Note that, in the present embodiment, a touch determination circuit is implemented by the touch coordinate calculation circuit 314.

Figure 46:
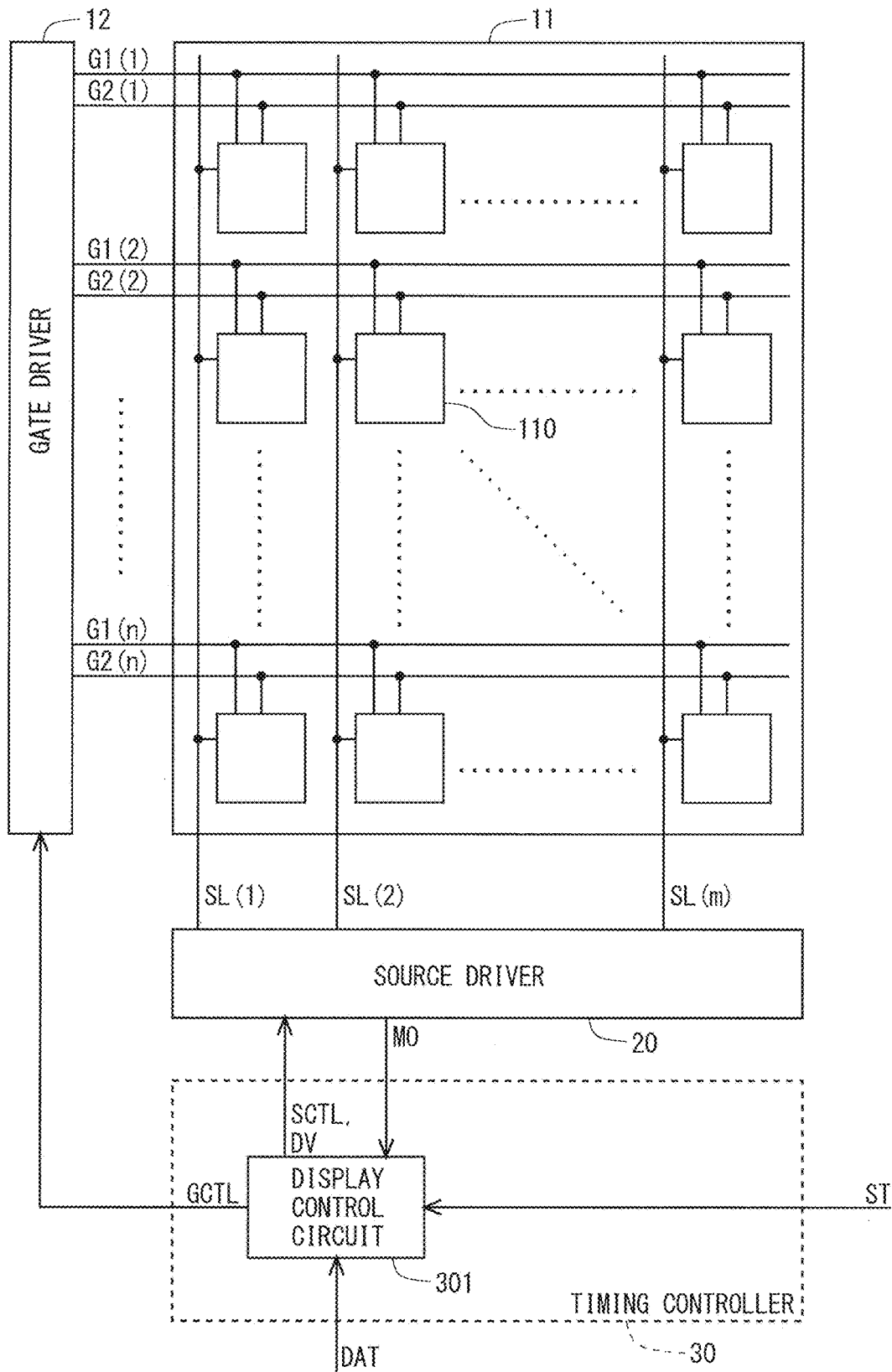
FIG. 46 is a block diagram showing a configuration for image display in the fourth embodiment.

FIG. 46 is a block diagram showing a configuration for image display in the present embodiment. As can be grasped from a comparison of FIGS. 1 and 46, the configuration of the timing controller 30 differs from that of the above-described first embodiment. Unlike the first embodiment, the timing controller 30 in the present embodiment does not include the touch position identification circuit 302 and the determination circuit 303. The display control circuit 301 controls performance of the characteristic detection process, based on the touch determination signal ST transmitted from the touch controller 31.

<4.2 Control of Performance of the Characteristic Detection Process>

Figure 47:
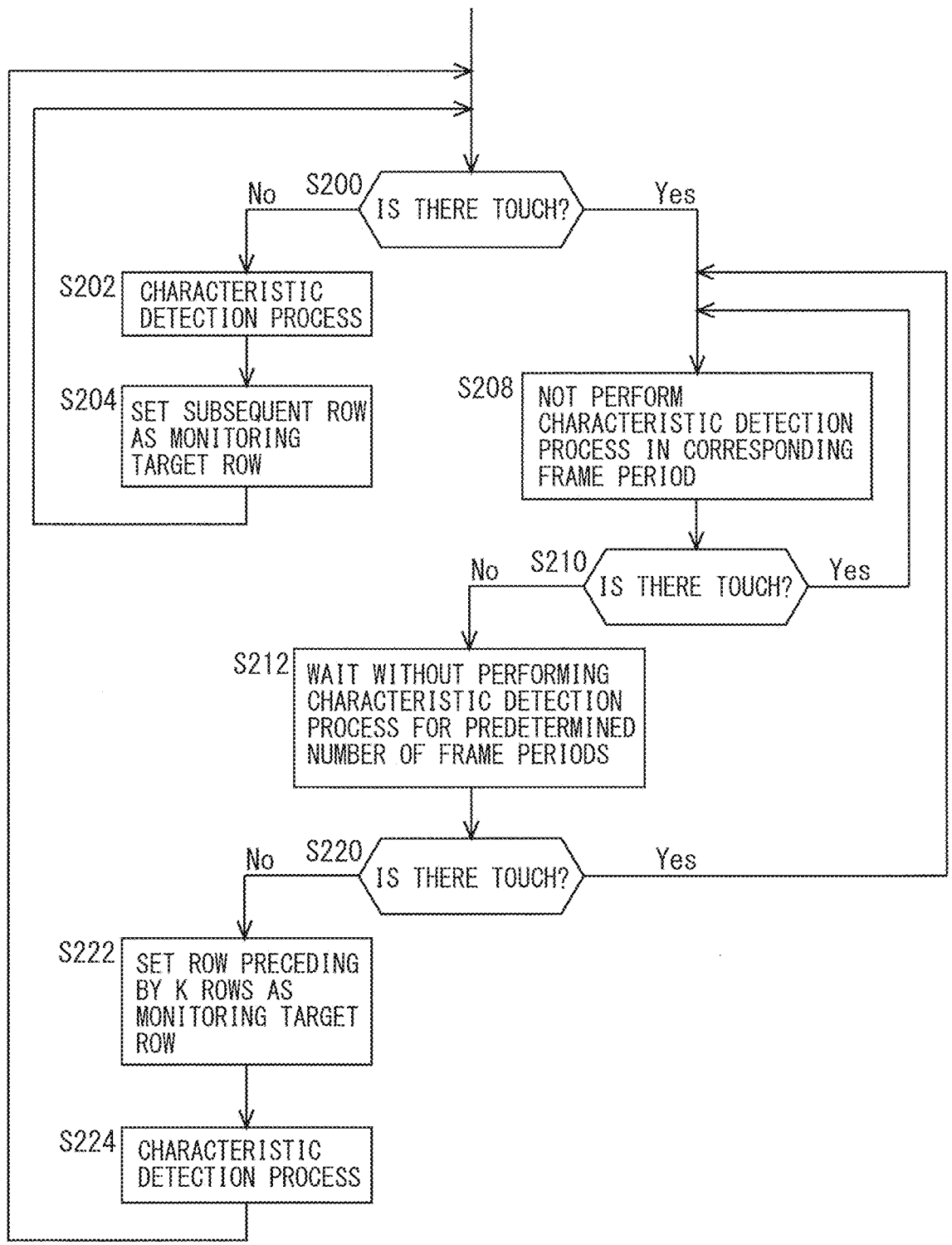
FIG. 47 is a flowchart for describing control of performance of the characteristic detection process in the fourth embodiment.
Figure 48:
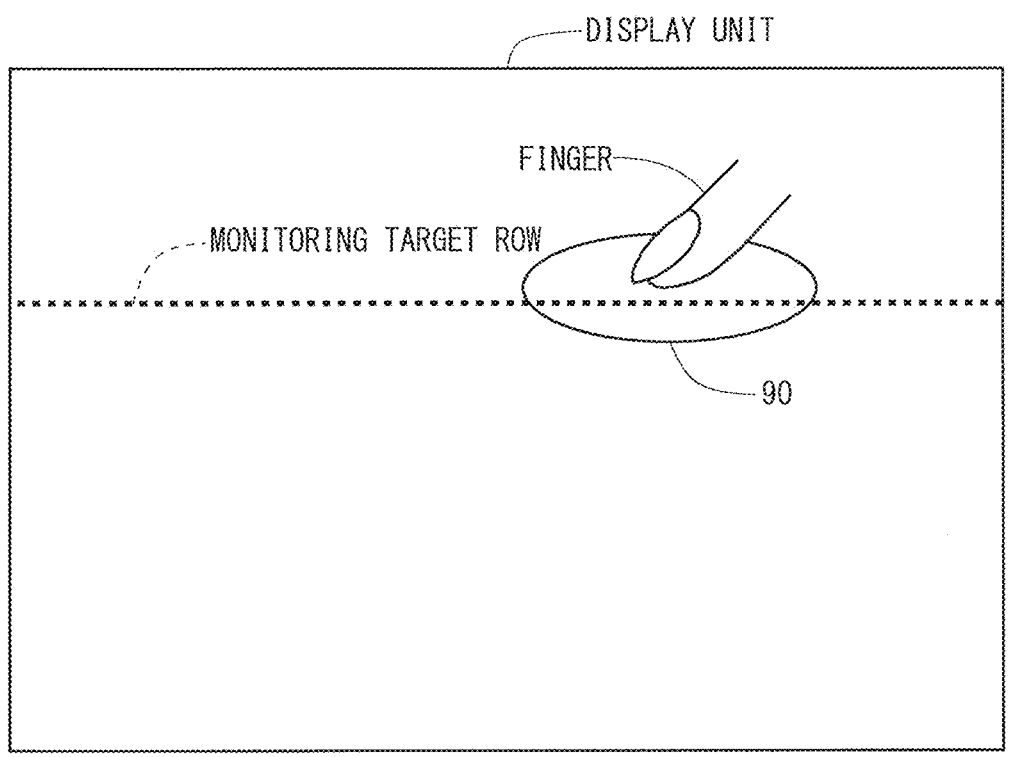
FIG. 48 is a diagram for describing an increase in the temperature of an area around a touched portion.

With reference to a flowchart shown in FIG. 47, control of performance of the characteristic detection process will be described. In the present embodiment, the touch coordinate calculation circuit 314 determines, every frame period, whether or not there is touch on the display unit 11, based on sensor values SV held in the sensor value holding memory 313. The touch determination signal ST indicating a determination result is transmitted from the touch controller 31 to the display control circuit 301 in the timing controller 30. From the above, the display control circuit 301 determines, every frame period, whether or not the touch determination signal ST indicates that there is touch on the display unit 11 (step S200, step S210, and step S220). Other processes are performed in the same manner as in the above-described first embodiment. That is, the processes in step S202, step S204, step S208, step S212, step S222, and step S224 in FIG. 47 are the same as the processes in step S102, step S104, step S108, step S112, step S122, and step S124 in FIG. 15, respectively.

As such, in the present embodiment, when the touch determination signal ST is at high level, i.e., when the touch coordinate calculation circuit 314 determines that there is touch on the display unit 11, the display control circuit 301 controls the operation of the gate driver 12 and the source drivers 20 such that the characteristic detection process of usual is stopped until the next time the touch coordinate calculation circuit 314 determines that there is no touch on the display unit 11. In addition, when the touch determination signal ST is at low level, i.e., when the touch coordinate calculation circuit 314 determines that there is no touch on the display unit 11, the display control circuit 301 controls the operation of the gate driver 12 and the source drivers 20 such that the characteristic detection process of usual is performed.

<4.3 Effects>

According to the present embodiment, in order to control performance of the characteristic detection process, the touch determination signal ST indicating whether or not there is touch on the display unit 11 is transmitted from the touch controller 31 to the timing controller 30, without transmitting data on sensor values SV obtained by the sensor value obtaining circuit 312 from the touch controller 31 to the timing controller 30. Based on the touch determination signal ST, the display control circuit 301 in the timing controller 30 controls performance of the characteristic detection process. By this, even if the timing controller 30 does not include therein a memory, etc., that can hold sensor values SV, the compensation computation process is prevented from being performed using monitoring data MO that is influenced by a temperature increase caused by touch. Thus, degradation of the drive transistors T2 or the organic EL elements 111 is appropriately compensated for. As above, according to the present embodiment, it becomes possible for the organic EL display device equipped with the touch panel 4 to suppress degradation in display quality caused by touch, even if the timing controller 30 does not hold a memory, etc., having enough free space.

5. Others

Although an organic EL display device is described as an example in each of the above-described embodiments (including the variants), the display device is not limited thereto. The content of the present disclosure can be applied to any display device including display elements driven by a current (display elements whose luminance or transmittance is controlled by a current). For example, the content of the present disclosure can also be applied to an inorganic EL display device including inorganic light-emitting diodes, a QLED display device including quantum dot light emitting diodes (QLEDs), etc.

DESCRIPTION OF REFERENCE CHARACTERS

1: ORGANIC EL PANEL
4: TOUCH PANEL
11: DISPLAY UNIT
12: GATE DRIVER
20: SOURCE DRIVER
21: DATA SIGNAL LINE DRIVING UNIT
22: CURRENT MONITORING UNIT
30: TIMING CONTROLLER
31: TOUCH CONTROLLER
50: HOST
110: PIXEL CIRCUIT
111: ORGANIC EL ELEMENT
301: DISPLAY CONTROL CIRCUIT
302: TOUCH POSITION IDENTIFICATION CIRCUIT
303, 316: DETERMINATION CIRCUIT
304, 315: COUNTER
311: TOUCH PANEL DRIVE CIRCUIT
312: SENSOR VALUE OBTAINING CIRCUIT
313: SENSOR VALUE HOLDING MEMORY
314: TOUCH COORDINATE CALCULATION CIRCUIT
T2: DRIVE TRANSISTOR

The invention claimed is:

1. A display device including: a display unit including a plurality of pixel circuits that form a pixel matrix of a plurality of rows x a plurality of columns, each of the plurality of pixel circuits having a display element driven by a current, and a drive transistor for controlling a current to be supplied to the display element; and a touch panel for detecting a touch position on the display unit, the display device comprising:
  a display drive circuit configured to drive the plurality of pixel circuits while performing a characteristic detection process to compensate for degradation of the drive transistor or the display element, the characteristic detection process including a process of measuring a current flowing through each of the plurality of pixel circuits;
  a sensor value obtaining circuit configured to obtain a sensor value that changes depending on a degree of approach of a detection object to the touch panel;
  a touch position identification circuit configured to identify a touch position on the display unit, based on the sensor value obtained by the sensor value obtaining circuit;
  a display control circuit configured to control operation of the display drive circuit such that the characteristic detection process is performed row-by-row and image display on the display unit is performed using video signals corrected based on current values obtained by performing the characteristic detection process; and
  a determination circuit configured to determine whether or not the characteristic detection process is influenced by touch, based on the touch position identified by the touch position identification circuit and a monitoring target row, the monitoring target row being a row to be subjected to the characteristic detection process, wherein
  when the determination circuit determines that the characteristic detection process is influenced by touch, the display control circuit controls operation of the display drive circuit such that the characteristic detection process of usual is stopped until the determination circuit determines that the characteristic detection process is not influenced by touch, and when the determination circuit determines that the characteristic detection process is not influenced by touch, the display control circuit controls operation of the display drive circuit such that the normal characteristic detection process of usual is performed.

2. The display device according to claim 1, wherein with La and Lb being natural numbers, the determination circuit compares a touch occurrence zone with a monitoring neighboring zone, and when there is a region in which the touch occurrence zone overlaps the monitoring neighboring zone, the determination circuit determines that the characteristic detection process is influenced by touch, and when there is not a region in which the touch occurrence zone overlaps the monitoring neighboring zone, the determination circuit determines that the characteristic detection process is not influenced by touch, the touch occurrence zone being a region that is associated with the touch position identified by the touch position identification circuit and that corresponds to La row(s) of the pixel matrix, and the monitoring neighboring zone being a region that includes the monitoring target row and corresponds to Lb row(s) of the pixel matrix.

3. The display device according to claim 2, wherein
with Pa and Pb being natural numbers, the Lb row(s) corresponding to the monitoring neighboring zone include the monitoring target row, Pa row(s) present more on a first-row side than the monitoring target row, and Pb row(s) present more on a last-row side than the monitoring target row, and
a value of the Pa and a value of the Pb can be freely set.

4. The display device according to claim 1, wherein
with Ma and Mb being natural numbers and Ma<Mb, the determination circuit compares a touch neighboring zone with the monitoring target row, and when the monitoring target row is included in the touch neighboring zone, the determination circuit determines that the characteristic detection process is influenced by touch, and when the monitoring target row is not included in the touch neighboring zone, the determination circuit determines that the characteristic detection process is not influenced by touch, the touch neighboring zone being a region that includes a touch occurrence zone and corresponds to Mb row(s) of the pixel matrix, the touch occurrence zone being a region that is associated with the touch position identified by the touch position identification circuit and that corresponds to Ma row(s) of the pixel matrix.

5. The display device according to claim 4, wherein
with Qa and Qb being natural numbers, the Mb row(s) corresponding to the touch neighboring zone include the Ma row(s) corresponding to the touch occurrence zone, Qa row(s) present more on a first-row side than the touch occurrence zone, and Qb row(s) present more on a last-row side than the touch occurrence zone, and
a value of the Qa and a value of the Qb can be freely set.

6. The display device according to claim 4, wherein when there are a plurality of touch positions identified by the touch position identification circuit, a plurality of touch neighboring zones are set so as to respectively correspond to the plurality of touch positions, and when the monitoring target row is included in any one of the plurality of touch neighboring zones, the determination circuit determines that the characteristic detection process is influenced by touch.

7. The display device according to claim 1, comprising a counter configured such that, for each frame period, a value of the counter increases when there is touch, and is set to 0 when there is no touch, wherein the determination circuit determines whether or not the characteristic detection process is influenced by touch, taking into account the value of the counter.

8. The display device according to claim 7, wherein
only one counter is provided,
for each frame period, the value of the counter increases when there is touch at any position on the display unit, and the value of the counter is set to 0 when there is no touch at any position on the display unit, and
when the value of the counter is smaller than a threshold value, regardless of a relationship between the touch position identified by the touch position identification circuit and the monitoring target row, the determination circuit determines that the characteristic detection process is not influenced by touch.

9. The display device according to claim 7, wherein
the counter is provided for each line corresponding to one row of touch coordinates being a unit of obtaining the sensor value by the sensor value obtaining circuit,
for each frame period, a value of each of counters increases when there is touch on a corresponding line, and is set to 0 when there is no touch on the corresponding line, and
with Lb being a natural number, the determination circuit compares a value of each of the counters corresponding to a monitoring neighboring zone with a threshold value, and when the value of any one of the counters corresponding to the monitoring neighboring zone is greater than or equal to the threshold value, the determination circuit determines that the characteristic detection process is influenced by touch, and when the values of all of the counters corresponding to the monitoring neighboring zone are less than the threshold value, the determination circuit determines that the characteristic detection process is not influenced by touch, the monitoring neighboring zone being a region that includes the monitoring target row and corresponds to Lb row(s) of the pixel matrix.

10. The display device according to claim 7, wherein
the counter is provided for each touch coordinates being a unit of obtaining the sensor value by the sensor value obtaining circuit,
for each frame period, a value of each of counters increases when there is touch on corresponding touch coordinates, and is set to 0 when there is no touch on the corresponding touch coordinates, and
with Lb being a natural number, the determination circuit compares a value of each of the counters corresponding to a monitoring neighboring zone with a threshold value, and when the value of any one of the counters corresponding to the monitoring neighboring zone is greater than or equal to the threshold value, the determination circuit determines that the characteristic detection process is influenced by touch, and when the values of all of the counters corresponding to the monitoring neighboring zone are less than the threshold value, the determination circuit determines that the characteristic detection process is not influenced by touch, the monitoring neighboring zone being a region that includes the monitoring target row and corresponds to Lb row(s) of the pixel matrix.

11. The display device according to claim 1, comprising a counter configured such that, for each frame period, a value of the counter increases when there is touch, and decreases, with a lower limit value being 0, when there is no touch, wherein the determination circuit determines whether or not the characteristic detection process is influenced by touch, taking into account a value of the counter.

12. The display device according to claim 11, wherein only one counter is provided,
for each frame period, the value of the counter increases when there is touch at any position on the display unit, and the value of the counter decreases when there is no touch at any position on the display unit, and
when the value of the counter is smaller than a threshold value, regardless of a relationship between the touch position identified by the touch position identification circuit and the monitoring target row, the determination circuit determines that the characteristic detection process is not influenced by touch.

13. The display device according to claim 11, wherein
the counter is provided for each line corresponding to one row of touch coordinates being a unit of obtaining the sensor value by the sensor value obtaining circuit,
for each frame period, a value of each of counters increases when there is touch on a corresponding line, and decreases when there is no touch on the corresponding line, and
with Lb being a natural number, the determination circuit compares a value of each of the counters corresponding to a monitoring neighboring zone with a threshold value, and when the value of any one of the counters corresponding to the monitoring neighboring zone is greater than or equal to the threshold value, the determination circuit determines that the characteristic detection process is influenced by touch, and when the values of all of the counters corresponding to the monitoring neighboring zone are less than the threshold value, the determination circuit determines that the characteristic detection process is not influenced by touch, the monitoring neighboring zone being a region that includes the monitoring target row and corresponds to Lb row(s) of the pixel matrix.

14. The display device according to claim 11, wherein
the counter is provided for each touch coordinates being a unit of obtaining the sensor value by the sensor value obtaining circuit,
for each frame period, a value of each of counters increases when there is touch on corresponding touch coordinates, and decreases when there is no touch on the corresponding touch coordinates, and
with Lb being a natural number, the determination circuit compares a value of each of the counters corresponding to a monitoring neighboring zone with a threshold value, and when the value of any one of the counters corresponding to the monitoring neighboring zone is greater than or equal to the threshold value, the determination circuit determines that the characteristic detection process is influenced by touch, and when the values of all of the counters corresponding to the monitoring neighboring zone are less than the threshold value, the determination circuit determines that the characteristic detection process is not influenced by touch, the monitoring neighboring zone being a region that includes the monitoring target row and corresponds to Lb row(s) of the pixel matrix.

15. The display device according to claim 1, wherein for a case in which the determination circuit determines that the characteristic detection process is influenced by touch, the characteristic detection process of usual is resumed after a lapse of a predetermined number of frame periods from when the determination circuit determines that the characteristic detection process is not influenced by touch.

16. The display device according to claim 1, wherein for a case in which the determination circuit determines that the characteristic detection process is influenced by touch, the characteristic detection process of usual is resumed in a state in which a row located more on a first-row side by K row(s) than a currently set row is set as the monitoring target row, with K being a natural number.

17. The display device according to claim 16, wherein a value of the K can be freely set.

18. A display device including: a display unit including a plurality of pixel circuits that form a pixel matrix of a plurality of rows x a plurality of columns, each of the plurality of pixel circuits having a display element driven by a current, and a drive transistor for controlling a current to be supplied to the display element; and a touch panel for detecting a touch position on the display unit, the display device comprising:
a first integrated circuit including a sensor value obtaining circuit configured to obtain a sensor value that changes depending on a degree of approach of a detection object to the touch panel; and a touch determination circuit configured to determine whether or not there is touch on the display unit, based on the sensor value obtained by the sensor value obtaining circuit; and
a second integrated circuit including a display drive circuit configured to drive the plurality of pixel circuits while performing a characteristic detection process to compensate for degradation of the drive transistor or the display element, the characteristic detection process including a process of measuring a current flowing through each of the plurality of pixel circuits; and a display control circuit configured to control operation of the display drive circuit such that the characteristic detection process is performed row-by-row and image display on the display unit is performed using video signals corrected based on current values obtained by performing the characteristic detection process, wherein
a touch determination signal indicating a result of the determination made by the touch determination circuit is transmitted from the first integrated circuit to the second integrated circuit,
when the touch determination signal transmitted to the second integrated circuit indicates that there is touch on the display unit, the display control circuit controls operation of the display drive circuit such that the characteristic detection process of usual is stopped until the touch determination signal indicating that there is no touch on the display unit is transmitted to the second integrated circuit, and
when the touch determination signal transmitted to the second integrated circuit indicates that there is no touch on the display unit, the display control circuit controls operation of the display drive circuit such that the characteristic detection process of usual is performed.

19. The display device according to claim 18, wherein for a case in which the touch determination signal transmitted to the second integrated circuit indicates that there is touch on the display unit, the characteristic detection process of usual is resumed after a lapse of a predetermined number of frame periods from when the touch determination signal indicating that there is no touch on the display unit is transmitted to the second integrated circuit.

20. The display device according to claim 18, wherein for a case in which the touch determination signal transmitted to the second integrated circuit indicates that there is touch on the display unit, the characteristic detection process of usual is resumed in a state in which a row located more on a first-row side by K row(s) than a currently set row is set as a row to be subjected to the characteristic detection process, with K being a natural number.

* * * * *